United States Patent [19]

Kiyama et al.

[11] Patent Number: 4,650,524
[45] Date of Patent: Mar. 17, 1987

[54] METHOD FOR DIVIDING SEMICONDUCTOR FILM FORMED ON A SUBSTRATE INTO PLURAL REGIONS BY BACKSIDE ENERGY BEAM IRRADIATION

[75] Inventors: Seiichi Kiyama; Hideki Imai, both of Osaka, Japan

[73] Assignee: Sanyo Electric Co., Ltd, Japan

[21] Appl. No.: 745,301

[22] Filed: Jun. 14, 1985

[30] Foreign Application Priority Data

Jun. 20, 1984 [JP] Japan ................. 59-126918
Jun. 29, 1984 [JP] Japan ................. 59-135825
Aug. 6, 1984 [JP] Japan ................. 59-165379

[51] Int. Cl.$^4$ .................. H01L 31/06; H01L 21/265
[52] U.S. Cl. ........................ 148/1.5; 29/572; 29/576 B; 148/175; 148/187; 357/30
[58] Field of Search ............ 148/1.5, 175, 187; 29/572, 576 B; 357/30

[56] References Cited

U.S. PATENT DOCUMENTS

| 4,281,208 | 7/1981 | Kuwano et al. | 148/1.5 |
| 4,292,092 | 9/1981 | Hanak | 148/1.5 |
| 4,456,490 | 6/1984 | Dutta et al. | 148/1.5 |
| 4,514,579 | 4/1985 | Hanak | 29/572 |
| 4,517,403 | 5/1985 | Morel et al. | 29/572 |
| 4,517,733 | 5/1985 | Hamano | 29/572 |
| 4,528,065 | 7/1985 | Yamazaki | 29/572 |
| 4,534,804 | 8/1985 | Cade | 148/1.5 |

FOREIGN PATENT DOCUMENTS 0022811 2/1980 Japan ................. 148/1.5

Primary Examiner—Upendra Roy
Attorney, Agent, or Firm—Darby & Darby

[57] ABSTRACT

An amorphous silicon film having a PIN junction inside in parallel to the film surface is formed extending continuously over transparent film electrodes in each plurality of regions being formed and spaced from each other on one main surface of a light transmissive substrate. A laser beam having a wave length covering a substantially ultraviolet rays region and a visible rays region is irradiated from the other main surface side of the light transmissive substrate to an adjacent spacing portion where the amorphous silicon film is to be divided and the amorphous silicon film lying therein is removed, thus the amorphous silicon film is divided into each plurality of regions. An aluminum electrode film is formed continuously covering the amorphous silicon film portions in each region. The laser beam is irradiated from the other main surface side of the light transmissive substrate to the adjacent spacing portion where the aluminum electrode film is to be divided and the aluminum electrode film lying therein is removed, thus the aluminum electrode film is divided in each plurality of regions. The divided aluminum film electrodes are connected to the transparent film electrodes in the adjacent regions, accordingly a plurality of photoelectric converting regions formed on the light transmissive substrate are connected in series.

29 Claims, 63 Drawing Figures

12'

12'

METHOD FOR DIVIDING SEMICONDUCTOR FILM FORMED ON A SUBSTRATE INTO PLURAL REGIONS BY BACKSIDE ENERGY BEAM IRRADIATION

BACKGROUND OF THE INVENTION

1. Field of the Invention

The present invention relates to a method of manufacturing a semiconductor device. More specifically, the present invention relates to a method of manufacturing a semiconductor device utilizing an energy beam, for example, such as a laser beam.

2. Description of the Prior Art

A solar cell or a linear optical sensor array are known as a semiconductor device using a semiconductor film as a photoactive layer. The present invention is directed to a method of manufacturing a semiconductor device having a plurality of photoelectric converting regions.

FIG. 1 is a cross-sectional view showing a fundamental structure of a prior solar cell. Such fundamental structure is disclosed, for example, in U.S. Pat. No. 4,281,208 assigned to the same assignee as the present invention. Here, the structure of solar cell shown in FIG. 1 will be described briefly within a limit necessary to understand the present invention.

A plurality of photoelectric converting regions 14a, 14b, 14c, - - - are formed on a glass substrate 10, transparent film electrodes 11a, 11b, 11c, - - - are formed corresponding respectively to these photoelectric converting regions at predetermined intervals. On each transparent film electrode 11a, 11b, 11c, - - - semiconductor film portions 12a, 12b, 11c, - - - constituted by an amorphous silicon are formed superposedly. Back film electrodes 13a, 13b, 13c, - - - extending as far as the adjacent transparent film electrodes and connected thereat are formed on semiconductor film portions 12a, 12b, 12c, - - - . Each semiconductor film portion 12a, 12b, 12c, - - - includes a PIN junction parallel to respective film surface and when light is incident through the glass substrate 10 and transparent film electrodes 11a, 11b, 11c, - - - photovoltaic forces are generated at respective semiconductor film portions 12a, 12b, 12c, - - - by the PIN junctions thereof. The photovoltaic forces generated by respective semiconductor film portions 12a, 12b, 12c, - - - are added arithmetically in series via the back film electrodes 13a, 13b, 13c, - - - connections to the adjacent transparent film electrodes.

For manufacturing the solar cell having such a structure a photoetching technique having super-high working precision is used. When using the photoetching technique, the process may be described with reference to the example in FIG. 1 as shown the transparent electrode film is first formed entirely on one main surface of the glass substrate 10, and photoresist film portions are formed on the areas corresponding to transparent film electrodes 11a, 11b, 11c. Next, etching is performed and the photoresist film portions are removed, for forming transparent film electrodes 11a, 11b, 11c. Thereafter, the semiconductor film is formed on the main surface of the glass substrate 10. The semiconductor film portions 12a, 12b, 12c, are formed by first forming photoresist film portions on the areas corresponding to the semiconductor film portions 12a, 12b, 12c, and thereafter etching. Although such photoetching is superb in the precise processing, it is susceptible to the defects on the semiconductor film due to pinholes in the photoresist film or peeling in a periphery of the photoresist film.

The above manufacturing without using the photoetching technique, can be accomplished using a laser beam as disclosed, for example, in U.S. Pat. No. 4,292,092 issued on Sept. 29, 1981. The method of irradiating via the laser beam is very effective in that precise processing can be performed without using the wet process at all.

However, according to the conventional method of irradiating via the laser beam, the following problems are still to be solved. When using the laser beam, the semiconductor film is divided into each photoelectric converting region by irradiating the laser beam to the adjacent spacing potion 12' of the photoelectric converting region in FIG. 2 and removing the semiconductor film in that portion, or the back electrode film is divided into each photoelectric converting region by irradiating the laser beam to the adjacent spacing portion 13' in FIG. 3 and removing the back electrode film thereof.

However, since the fused residues 12r or 13r of the semiconductor film or the back electrode film remain in the adjacent spacing portions 12' or 13', an accurate patterning can not be accomplished. Such residues 12r or 13r tend to remain in the both sides of the scanning axis of the laser beam. This is caused by the fact that, since the distribution of the energy density of the laser beam is slightly in the normal distribution, the energies in both side ends of the adjacent spacing portions 12' and 13' are smaller than that in the center thereof. Thus, the residues 12r or 13r in the adjacent spacing portions 12' or 13' to be removed, cause various problems. When the residue 12r of the semiconductor film remains in the adjacent spacing portion 12' in FIG. 2, after being divided into the semiconductor film in each respective region, the bonding strength of the back electrode film formed thereupon tends to reduce, ultimately resulting in a separation defect of the back electrode film. Then, when the residue 13r of the back electrode film material remains in the adjacent spacing portion 13' in FIG. 3, a short circuit defect may occur due to the direct contact of the transparent electrode film and the back electrode film in the same photoelectric converting region (cell).

Moreover, in order to connect the adjacent photoelectric converting regions 14a, 14b, 14c, - - - in series, for example, a portion of the transparent film electrode 11b having a length D exposed from the semiconductor film portion 12b on the right in FIG. 2, must be elongated to the greatest extent possible without reducing the effective area relative to the photoelectric converting region. In order to satisfy such a requirement, a prior art practice has been to reduce the scanning speed or to increase the scanning times of the laser beam. However, this decreases productivity and increases cost.

SUMMARY OF THE INVENTION

The principal object of the present invention is, therefore, to provide a method of manufacturing a semiconductor device without having any defect caused by a residue, even when using an energy beam.

Another object of the present invention is to provide a method of manufacturing a semiconductor device, which is capable of improving the separation precision of each photoelectric converting region.

It is a further object of the present invention to provide a method of manufacturing a semiconductor device which is free from causing any damage to other portions besides the portion to be processed by the energy beam.

The present invention, is in brief, a method of manufacturing a semiconductor device, which is adapted to divide a semiconductor film formed on one main surface of a substrate into a plurality of regions by irradiating an energy beam from the other main surface side of the substrate.

According to the present invention, a precise processing characteristic by the energy beam such as a laser beam may be exhibited effectively. More specifically, in the present invention, since the semiconductor film lying in the adjacent spacing portions of each photoelectric converting region is adapted to be removed by the energy beam irradiated from the other main surface side of the substrate, the residue of the semiconductor film which causes a peeling defect of the back film electrode in a solar cell and brings about a deterioration of the patterning precision in a linear optical sensor array is eliminated and the adjacent spacing portions thereof clearly processed. Since the energy beam is irradiated from the other main surface side of the light transmissive substrate, an interface of the other surface side of the semiconductor film can be also fused sufficiently, accordingly the separation width of the semiconductor film portions may be increased even by using the energy beam having a relatively small output power. Therefore, even when manufacturing a solar cell requiring relatively wide adjacent spacing portions, it is not necessary to reduce the scanning speed nor to increase the scanning times of the energy beam, resulting in increased productivity.

In the preferred embodiment of the present invention, the back electrode film is also divided into each photoelectric converting region by the energy beam irradiated from the other surface side of the light transmissive substrate. According to the preferred embodiment, the presence of residue in the adjacent spacing portions of the back film electrodes are suppressed and the negative influence of the residue of the electrode film thereof, for example, a short-circuit defect of the photoelectric converting region (cell) in the solar cell is avoided.

In another preferred embodiment of the present invention, the semiconductor film and the back electrode film are formed on one main surface of the light transmissive substrate, thereafter the energy beam is irradiated from the other main surface of the light transmissive substrate and the semiconductor film and the back electrode film are divided into each region simultaneously. In the preferred embodiment, since the back electrode film is formed immediately after the forming of the semiconductor film, the attachment of the dust, moisture, and other contaminants to the surface of the semiconductor film may be prevented by the back electrode film.

In the preferred embodiment of the present invention, the laser beam is used as the energy beam having a wavelength selected to cover both substantially ultraviolet rays region and a visible rays region. According to the preferred embodiment, since the laser beam having such a specific wavelength is used, the fluctuation of the processing threshold value of an energy density for the amorphous silicon derivative semiconductor film due to the film thickness of the semiconductor film is suppressed. As a result, damage to the lower layer, for example, to the transparent film electrode or conversely, and insufficient processing of the semiconductor film proper is substantially avoided. Moreover, since an absorptivity in the semiconductor film relative to the laser beam having such a specific wavelength as described above is large, the temperature difference between both sides of the semiconductor film can be increased thereby further reducing thermal damage to the lower layer thereof.

These objects and other objects, features, aspects and advantages of the present invention will become more apparent from the following detailed description of the embodiment when taken in connection with the accompanying drawings.

BRIEF DESCRIPTION OF THE DRAWINGS

FIGS. 17 and 18 are graphs for comparing an absorptivity (A), a reflection factor (R), and a transmittivity (T) of a laser beam relative to a laminate of a light transmissive substrate, a transparent electrode film, and an amorphous silicon derivative semiconductor film having the same construction, wherein FIG. 17 is relative to FIG. 12, and FIG. 18 is relative to FIG. 11.

FIGS. 25 and 26 are optical analysis with respect to a back electrode film, wherein FIG. 25 shows the graph when a laser beam is irradiated from the other main surface side of a substrate as shown in FIG. 11, while FIG. 26 shows the graph when the laser beam is irradiated from one main surface side of the substrate as shown in FIG. 12.

FIGS. 40 and 41 are illustrated views showing a state of an adjacent spacing portion of a semiconductor film, wherein FIG. 40 shows results of the present embodiment, and FIG. 41 shows the result of a method of a comparative example.

DESCRIPTION OF THE PREFERRED EMBODIMENTS

FIG. 4 through FIG. 9 are cross sectional views showing an embodiment of the present invention in sequence of process. First, in the process in FIG. 4, a substrate 10 constituted by transparent glass, for example, having a thickness of approximately 1 mm to 3 mm and an area of roughly 10 cm×10 cm to 30 cm×30 cm is prepared. Then, a transparent electrode film 11 consisting of tin oxide ($SnO_2$) having a thickness of 2000 Å to 5000 Å is formed entirely on one main surface of the substrate 10.

Figure 5:
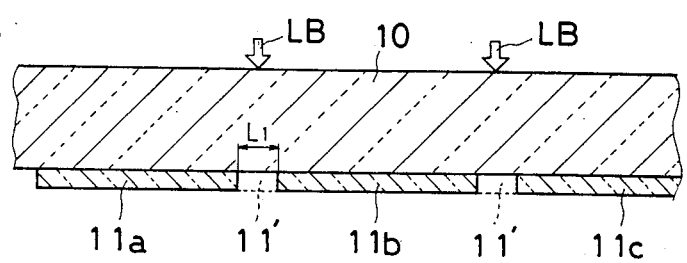

In the process in FIG. 5, a laser beam is irradiated to an adjacent spacing portion 11' and the transparent electrode film therein is removed, thereby an individual transparent film electrode 11a, 11b, 11c, - - - in each region is formed. A suitable is one which generates a laser apparatus laser beam having a wavelength such that the beam is hardly absorbed by the substrate 10. A pulse irradiation type of apparatus, for example, having a wavelength of 0.30 μm–2.5 μm is preferable with respect to the glass substrate. In the embodiment, a Nd:YAG laser having a wave length of approximately 1.06 μm, an energy density of 13 J/cm² and a pulse frequency of 3 kHz was used. The distance $L_1$ in the adjacent spacing portion 11' is about 100 μm.

Figure 6:
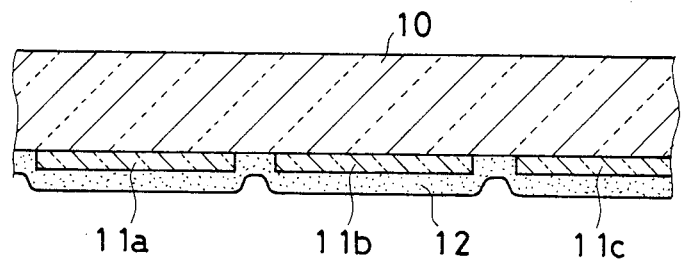

In a process in FIG. 6, an amorphous semiconductor film 12 such as an amorphous silicon, for example, is formed entirely on the substrate 10 covering the surfaces of each transparent film electrode 11a, 11b, 11c, - - - . A film thickness of the amorphous semiconductor film 12 is selected at 5000 Å to 7000 Å so as to contribute effectively to the photoelectric converting. The semiconductor film 12 includes a PIN junction therein, in parallel to a film surface. More specifically, first a P type amorphous silicon carbide is formed, then the amorphous silicon of I and N types are successively deposited by a well known method.

Figure 7:
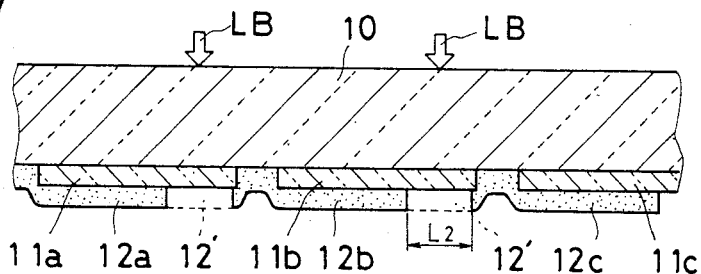
Figure 10:
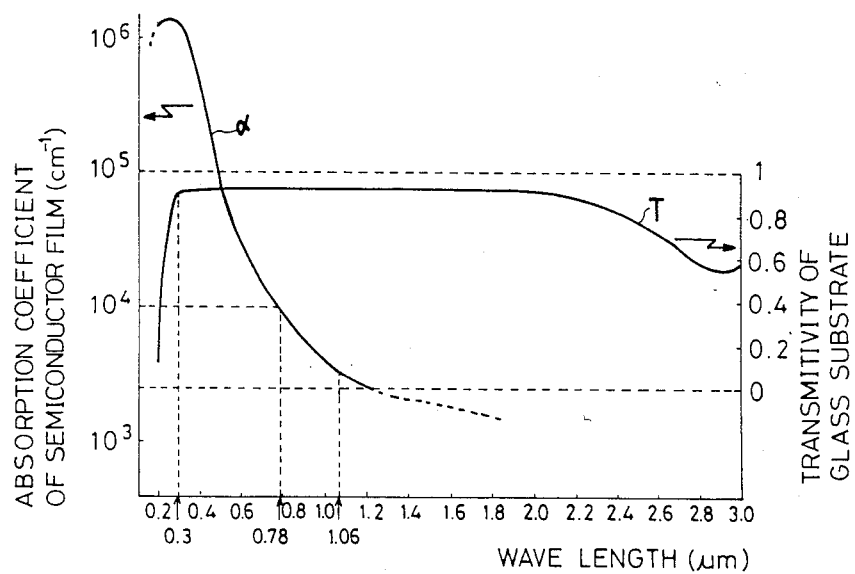
FIG. 10 is a graph showing a relation between an absorption coefficient of a semiconductor film, the transmittivity of a glass substrate, and a wavelength of a laser beam.

In FIG. 7, the laser beam is irradiated from the other main surface side of the substrate 10 to the adjacent spacing portion 12' as indicated by the arrow and the semiconductor film 12 lying in that portion is removed, thereby forming an individual amorphous semiconductor portion 12a, 12b, 12c, - - - in each region. A laser generates a laser beam having a wavelength region absorbed relatively easily by the amorphous silicon derivative semiconductor film 12 is suitable to be used in the process. The amorphous silicon derivative semiconductor film 12 of the embodiment has, for example, as shown in FIG. 10, a high absorption coefficient (μ) relative to the laser beam having a wavelength in an ultraviolet rays region and a visible rays region. A transmittivity T of glass which is most suitable as a material for the substrate 10 is more than 90% above a wavelength of about 0.3 μm. Accordingly, a pulse irradiation type laser apparatus having a wavelength in an ultraviolet rays and a visible rays region of more than about 0.30 μm is preferable, for example. In the embodiment, the pulse irradiation type laser having a wavelength of 0.53 μm is used.

An upper limit of the wavelength in the visible rays region is in the neighborhood of 0.830 μm, wherein the absorption coefficient is higher with a value of $10^4$ $cm^{-1}$, as compared with the wavelength of 1.06 μm as disclosed in the prior art U.S. Pat. No. 4,292,092, previously cited.

Meanwhile, the transmittivity T shown in FIG. 10 of the glass used as the substrate 10, has a characteristic of a Model No. "7740" by U.S. Coning (registered trademark PILEX).

The irradiation conditions of the pulse irradiation type laser used in the process in FIG. 7, are a pulse repeated frequency of 4 kHz, and an energy density of 0.7 $J/cm^2$, thereby removing a distance $L_2$ of the adjacent spacing portion 12' of about 300 μm to 500 μm.

In irradiating the laser beam in FIG. 7, note that the irradiating direction of the laser beam is not from an exposed surface side of the amorphous semiconductor film 12 but from a bonding interface side with the transparent film electrodes 11a, 11b, 11c, - - - , that is, from the other main surface side of the substrate 10.

Figure 12:
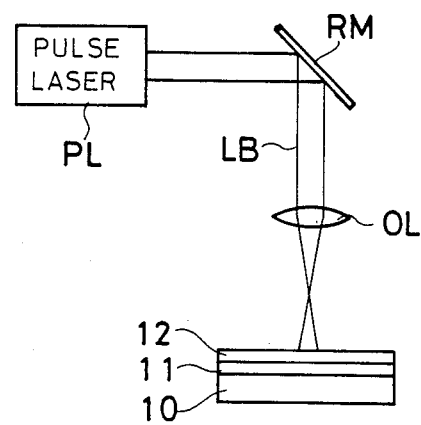
FIG. 12 is an illustrated view showing an irradiation method of a laser beam of a comparative example.

When the laser beam is irradiated from one main surface side of the substrate as in FIG. 12, the semiconductor film is vaporized gradually and removed from that surface side. Therefore, in this case, should the laser beam have a typical energy distribution of a normal type, a cross section of the adjacent spacing portion 12' of almost normal shape occurs, along with the residue due to the incomplete removal of the semiconductor film.

On the contrary, when the laser beam is irradiated from the diametrically opposite other main surface side of the substrate 10, the laser beam reaches first to the amorphous semiconductor film 12 in the interface with the transparent film electrodes 11a, 11b, 11c, - - - after passing through the substrate 10 and the transparent film electrodes 11a, 11b, 11c, - - - . Accordingly, it substantially removes the semiconductor film of the adjacent spacing portion 12' from the interface mentioned above. At this time, the amorphous semiconductor film 12 fused by the irradiation of the laser beam is naturally in a circumposed state by the substrate 10, the transparent film electrodes 12a, 12b, 12c, - - - and the amorphous semiconductor film 12 yet to be fused. Accordingly, the amorphous semiconductor film which starts fusing from the interface, continues to fuse toward the exposed surface (external surface) therefrom as it expands. Next, at the point where the film thickness of the semiconductor film has become extremely thin, the fused material will break from the thin portion and be substantially dispersed into the air. As a result, substantially no residue will remain in the adjacent spacing portion 12' after the processing.

Figure 11:
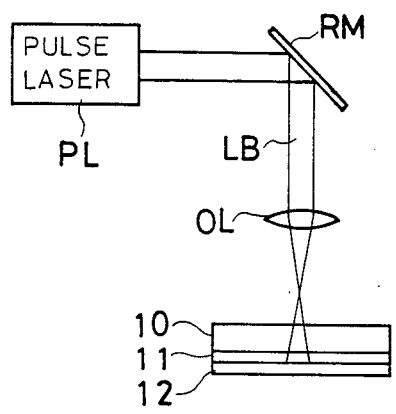
FIG. 11 is an illustrated view showing an irradiation method of a laser beam in the embodiment shown in FIG. 4 through FIG. 9 theoretically.

The process in FIG. 7 may be realized by a device as shown in FIG. 11. As shown, the laser beam LB irradiated from a laser apparatus PL reaches the amorphous semiconductor film 12 being processed, via a reflecting mirror MR, an objective lens OL, the substrate 10 and the transparent electrode film 11. In a method of a comparative example, the laser beam LB having a beam diameter being adjusted by the objective lens OL as shown in FIG. 12, is irradiated directly to a surface of an amorphous semiconductor film 12 without passing through a substrate 10 and a transparent electrode film 11.

The difference in processing characteristics of the laser beam LB in the base by the method of FIG. 11 and the base by the method of FIG. 12 will be described below based upon the theoretical calculations and the experimental results.

Figure 13:
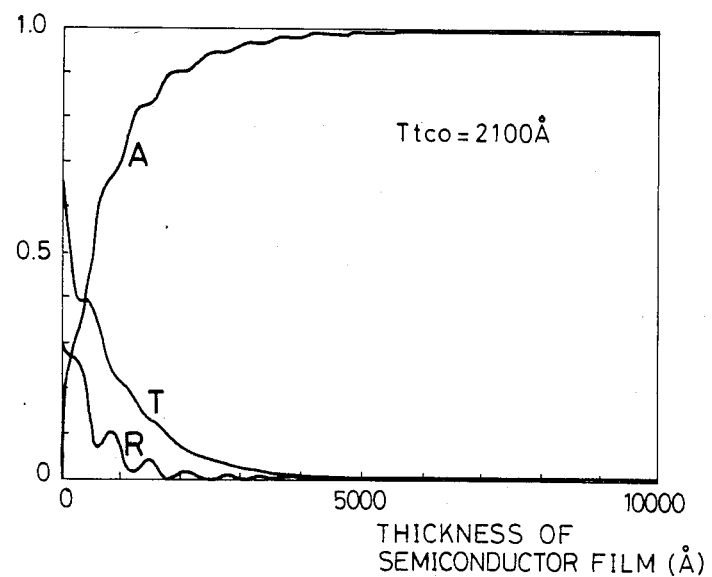
FIG. 13 through FIG. 15 are graphs respectively showing optical analysis of an absorptivity (A), a reflection factor (R), and a transmittivity (T), of a laser beam in an amorphous silicon derivative semiconductor film in each different film thickness of a transparent electrode film, when the laser beam is irradiated by the method shown in FIG. 11.
Figure 14:
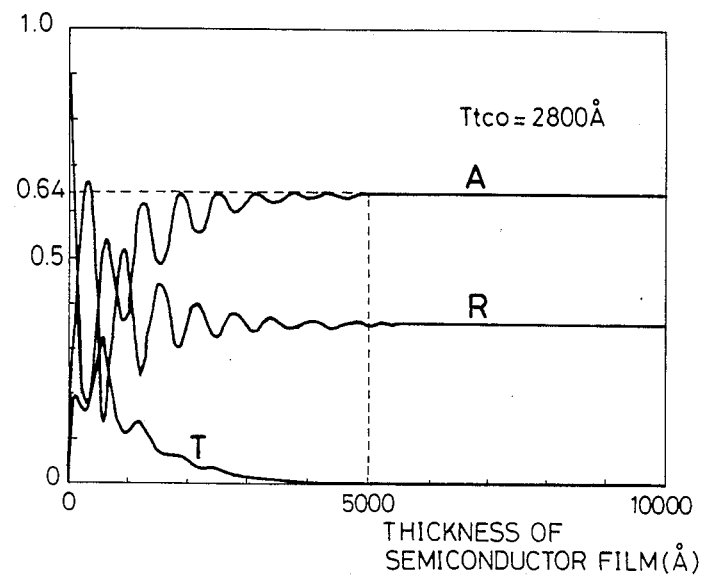
Figure 15:
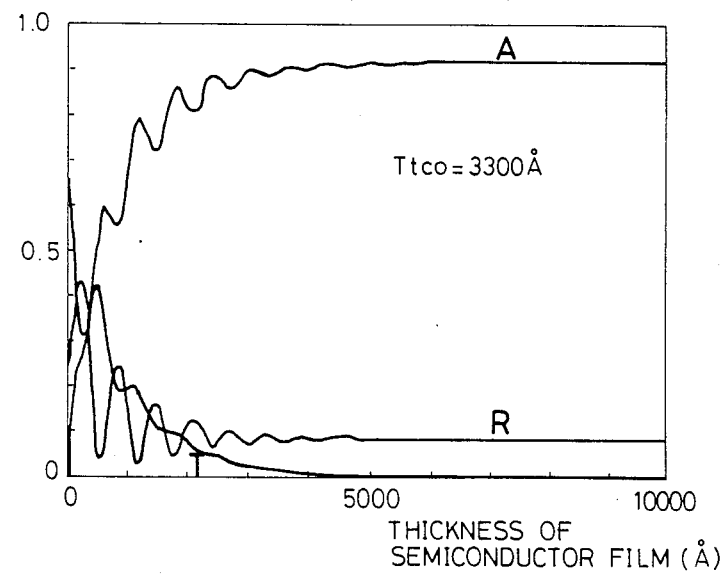

FIGS. 13, 14 and 15 are graphs showing an optical analysis of each magnitude of an absorptivity (A), a reflection factor (R), and a transmittivity (T), using a film thickness of the transparent electrode film 11 when irradiating the laser beam LB having a wavelength of 0.53 μm to the amorphous silicon derivative semiconductor film 12 from the other main surface side of the substrate 10 according to FIG. 11, wherein an abscissa denotes the film thickness of the amorphous semiconductor film 12 and an ordinate denotes each magnitude respectively. The film thickness (Ttco) of the transparent electrode film 11 of FIG. 13 is about 2100 Å, while in FIGS. 14 and 15 the thicknesses are respectively about 2800 Å and about 3300 Å, which are all within a range of film thickness being used as the transparent electrode film 11 in typical usual photovoltaic devices.

According to the method of FIG. 11, as in FIGS. 13 through 15, the absorption characteristics in the semiconductor film 12 varies in accordance with the film thickness of the transparent electrode film 11 disposed on the irradiating surface side thereof. However, the absorptivity (A) is about 64% when the film thickness of the amorphous semiconductor film 12 is approximately 5000 Å or above 4000 Å which is practically usable as an optical active layer, even at a minimum case in FIG. 14, and reaches to 99% at a maximum case in FIG. 13.

Figure 16:
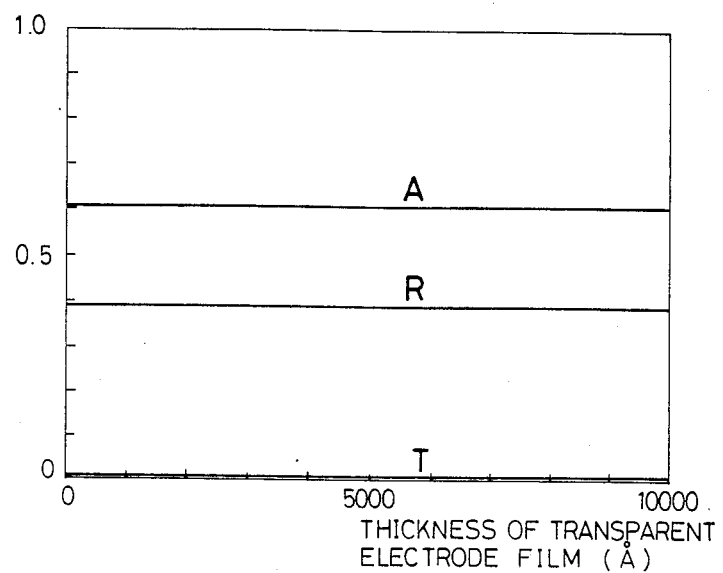
FIG. 16 is a graph showing an optical analysis of a dependency of an absorptivity (A), a reflection factor (R), and a transmittivity (T), of a laser beam in an amorphous silicon derivative semiconductor film relative to a film thickness of a transparent electrode film, when the laser beam is irradiated by the method shown in FIG. 12.

On the other hand, FIG. 16 shows a relation between each magnitude of the absorptivity (A), the reflection factor (R), the transmittivity (T), and the film thickness of the transparent electrode film 11, when the laser beam LB is irradiated from the exposed surface of the amorphous semiconductor film according to the method of the comparative example shown in FIG. 12. From FIG. 16, it is apparent that in the method shown in FIG. 12, neither of the magnitudes of A, R and T is dependent upon the film thickness of the transparent electrode film 11.

Figure 17:
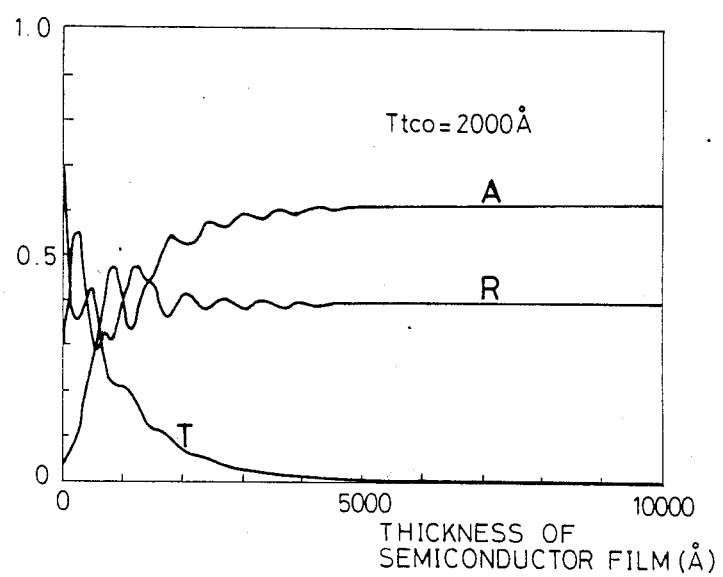

FIG. 17 is a theoretical calculation of the dependency based upon FIG. 16, relative to the film thickness of the amorphous semiconductor film 12, when the film thickness Ttco of the transparent electrode film 11 is fixed at 2000 Å, in using the method of the comparative example of FIG. 12.

Figure 18:
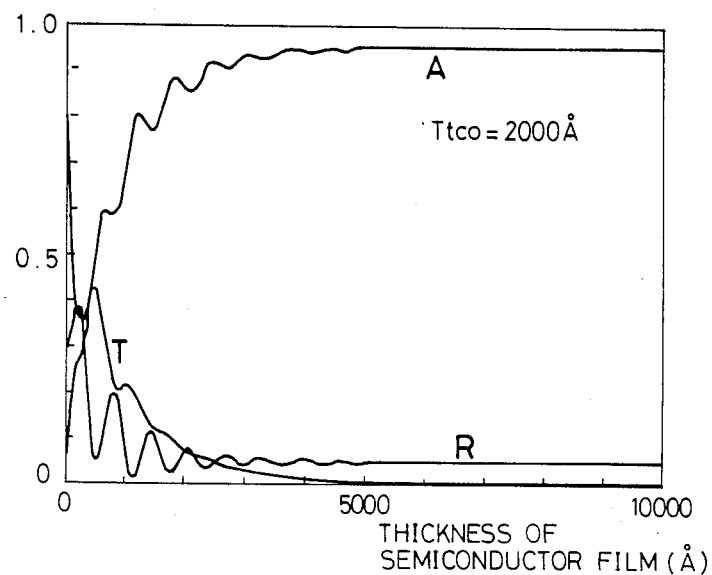

FIG. 18 is a graph corresponding to FIG. 17 relative to the method in the embodiment of FIG. 11. The laser apparatus and other setting conditions used are both the same, except for the irradiating direction of the laser beam LB. As apparent from FIGS. 17 and 18, in the method of FIG. 11, the absorptivity (A) in the amorphous semiconductor film 12, exceeds 90% at the film thickness of the semiconductor film 12 practically usable. Accordingly, processing by the laser beam of the lower output is possible in the method of FIG. 11 as compared with the method of FIG. 12.

Figure 19:
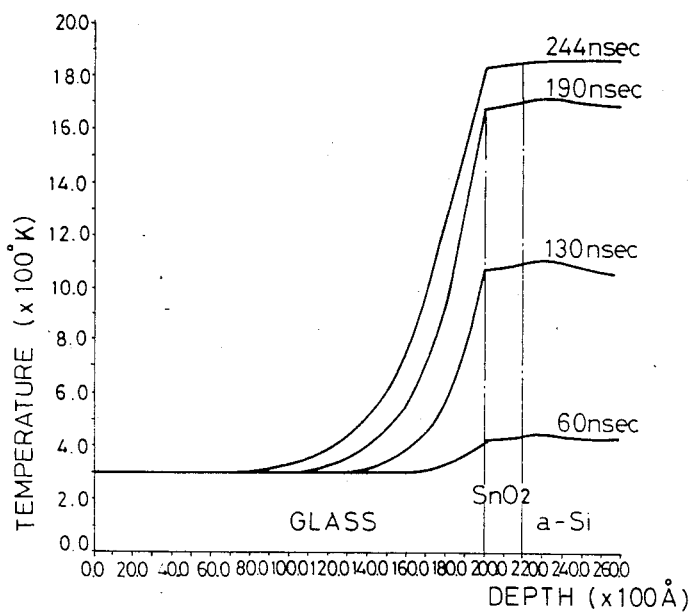
FIG. 19 is a graph showing a temperature distribution in a depth or a thickness direction of the laminate mentioned above according to the embodiment of the present invention.
Figure 20:
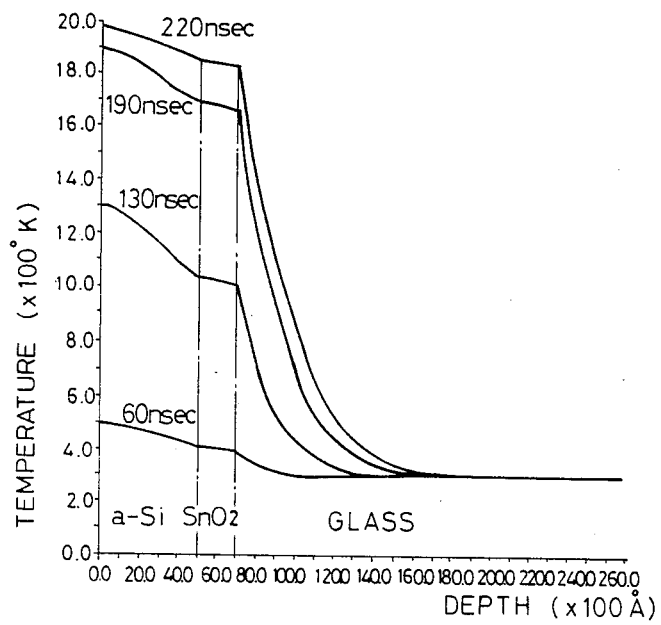
FIG. 20 is a graph showing a temperature distribution in a depth or a thickness direction of the laminate mentioned above according to a method of a comparative example.

FIGS. 19 and 20 are graphs in which the temperature distribution, when the laser beam LB is irradiated at the energy density based upon the reflection factor and the absorptivity obtained by FIGS. 17 and 18, is simulated. In the simulation, the energy density of the laser beam in the case of FIG. 19, namely, FIG. 11 was set at 0.351 J/cm$^2$, and that in the case of FIG. 20, namely, FIG. 12 was set at 0.559 J/cm$^2$. Although the energy density is lower in case of the method of FIG. 11, the temperature rises after the start of irradiation has elapsed, are almost equal for the both cases.

Figure 21:
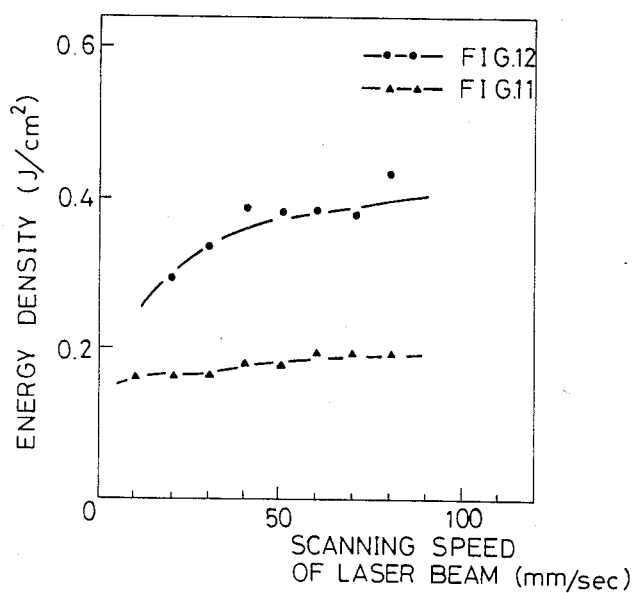
FIG. 21 is a graph showing the methods by the embodiment of the present invention and a comparative example with respect to the limit of the selective removal of an amorphous silicon derivative semiconductor film.
Figure 22:
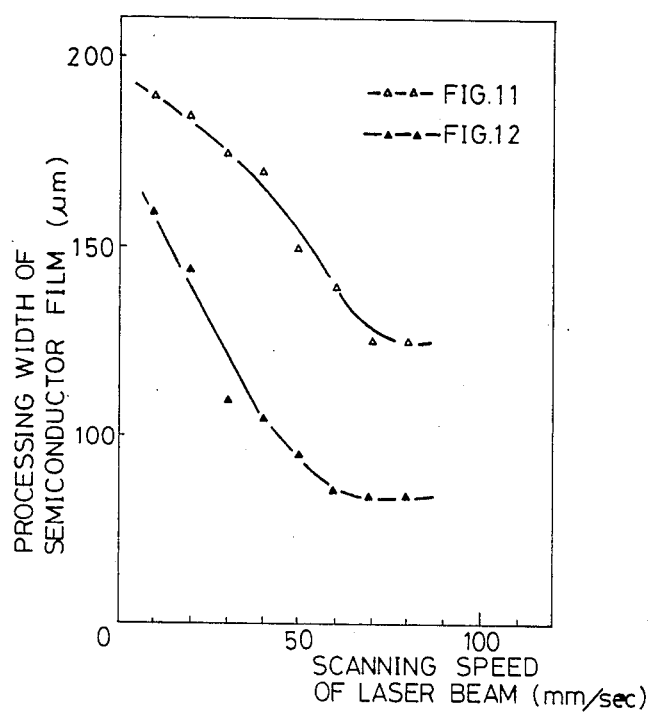
FIG. 22 is a graph showing the method by the embodiment of the present invention and a comparative example with respect to the processing width of an amorphous silicon derivative semiconductor film.

The comparative graphs of the methods of FIGS. 11 and 12 with respect to the energy density when the laser beam LB is practically irradiated based upon the foregoing theoretical calculation and the processing width (removing width) of the amorphous semiconductor film 12 are shown in FIGS. 21 and 22. FIG. 21 shows a relation between the threshold value energy density and the scanning speed of the laser beam necessary for removing the amorphous silicon derivative semiconductor film 12 having the film thickness of about 6000 Å, without causing any thermal damage to the transparent electrode film 11 being formed already. As apparent from the graph, the energy density of the method of FIG. 11 wherein the laser beam is irradiated from the other main surface side of the substrate 10, is about one half of the method of FIG. 12.

Figure 1:
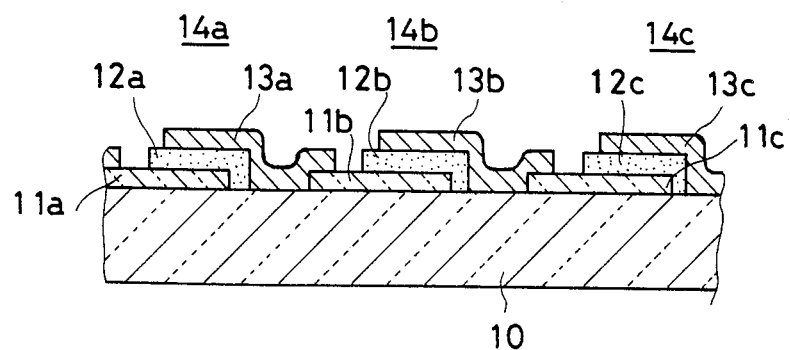
FIG. 1 is a cross sectional view showing a basic structure of a solar cell where the present invention is applicable and constituting the background of the present invention.
Figure 2:
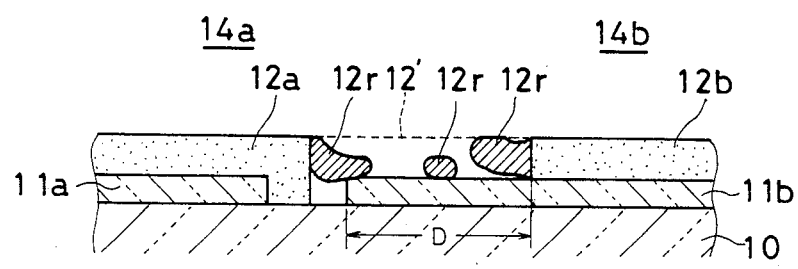
FIGS. 2 and 3 are enlarged cross sectional views respectively for explaining the defects of the prior art methods.

FIG. 22 shows the width of semiconductor film that 12 can be removed with one scanning of the laser beam LB to the amorphous semiconductor 12, in which it is clear that the method of FIG. 11 greater processing widths than the method of FIG. 12. As a result, the exposed length of the transparent electrode film 11$b$ shown by a symbol D in FIG. 2 may be sufficiently enlarged without reducing the scanning speed nor increasing the scanning times of the laser beam too much, thus providing of productivity improvements.

The laser apparatus used commonly in the experiments mentioned above, is the pulse irradiation type having a pulse frequency of 4 kHz and a wave length of 0.53 μm.

Figure 23:
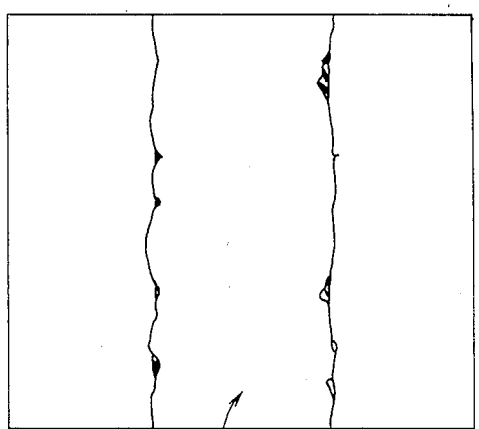
FIG. 23 is an enlarged plan view of a removed portion (adjacent spacing portion) of an amorphous silicon derivative semicondcutor film by the embodiment.
Figure 24:
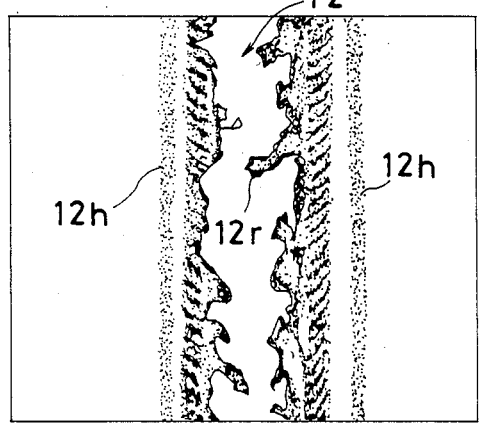
FIG. 24 is an enlarged plan view of a removed portion of an amorphous silicon derivative semiconductor film by a method of a comparative example.

FIGS. 23 and 24 are plan views in the adjacent spacing portion 12' when the amorphous semiconductor film 12 is scanned once by the pulse irradiation type laser apparatus as mentioned above according to the method of FIGS. 11 and 12 respectively. Both drawings are seen from the same direction. In the drawings, the laser apparatus used is the pulse irradiation type having a wave length of 0.53 μm and the conditions such as the laser output power and the scanning speed are the same except for the irradiating direction of the laser beam LB. FIG. 23 shows the result when the laser beam is irradiated from the other main surface side of the substrate 10 as in FIG. 11, while FIG. 24 shows the result by the method of FIG. 12.

Note that by the method in the embodiment of the present invention, although the processing is performed under the same conditions except for the irradiating direction as such, not only is a clean processing interface without any residue obtained, but also the wider processing (removing) width is obtained. Moreover, an occurrence of the deteriorated portion 12$h$ of the semiconductor film due to the heat seen in the processing interface in case of the method of FIG. 12 has been suppressed.

Figure 8:
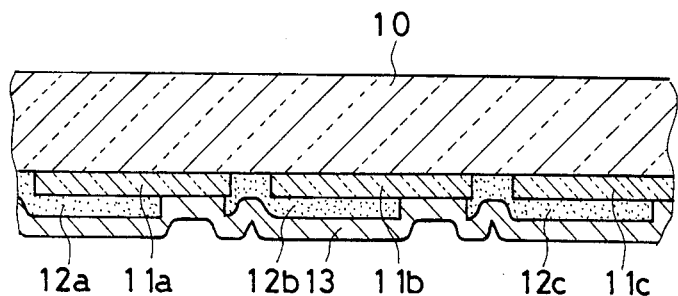

The process shown in FIG. 8 will follow the completion of the process in FIG. 7. In this process, the back electrode film 13 having a thickness of approximately 4000 Å to 2 μm is formed on the substrate 10 covering the amorphous semiconductor film portions 12$a$, 12$b$, 12$c$, - - - and the transparent film electrodes 11$a$, 11$b$, 11$c$, - - - . The back electrode film 13 may include a single layer contruction of aluminum or a double layer construction of aluminum laminated by titanium or titanium silver. A stacked construction of such double layer construction or a sandwich construction of aluminum sandwiched by titanium or titanium silver will be usable.

Figure 9:
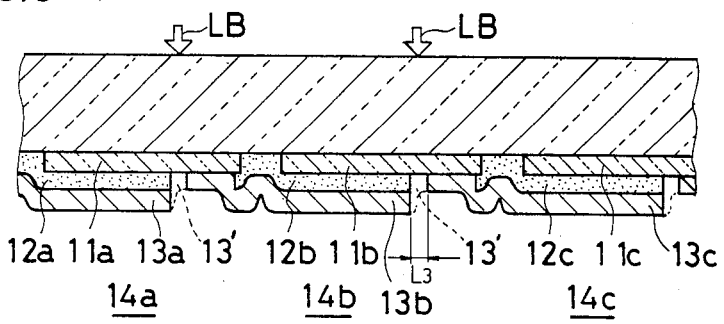

In the final process in FIG. 9, the laser beam LB is irradiated to the adjacent spacing portion 13' and the back electrode film lying therein is removed, thereby forming individual back film electrodes 13$a$, 13$b$, 13$c$, - - - in each region formed, respectively. As a result, each photoelectric converting region 14$a$, 14$b$, 14$c$, - - - is electrically connected in series. In this process, the laser beam LB is irradiated from the other main surface side of the substrate 10 in the same manner as the irradiating direction to the amorphous semiconductor film 12, when the adjacent spacing portion 13' to be removed is positioned on the exposed portions of the transparent film electrodes 11$a$, 11$b$, 11$c$, - - - . The laser apparatus used in this process is the pulse irradiation type having a wave length of 1.06 μm, and the energy density is about 3 J/cm$^2$. The distance L$_3$ of the adjacent spacing portion 13' is set, for example, at approximately 20 μm to 100 μm.

Figure 25:
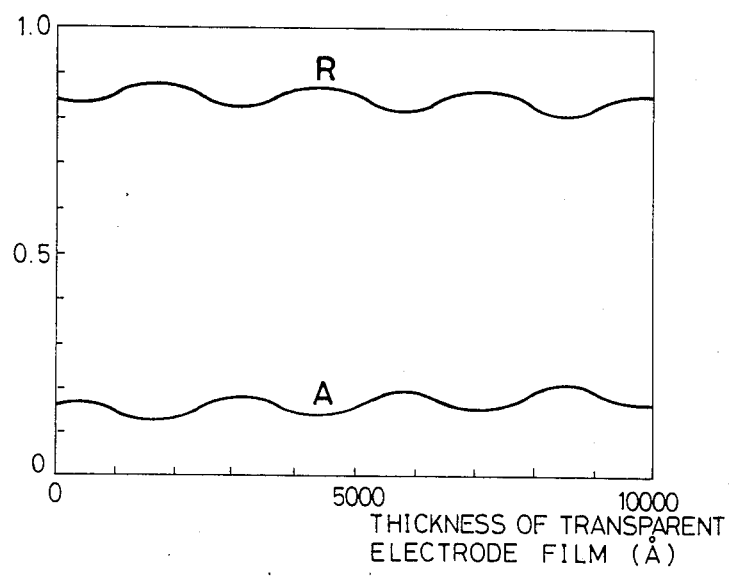
Figure 26:
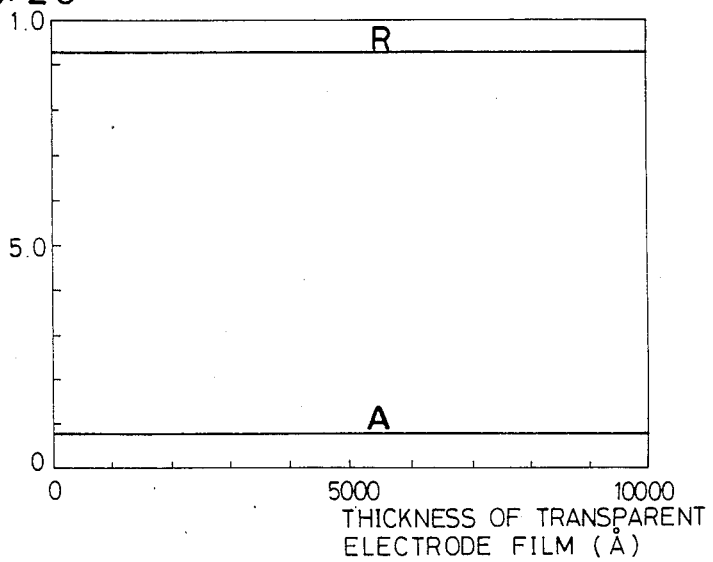

FIG. 25 is a graph showing a result of the optical analysis of the dependency of the absorptivity (A), the reflection factor (R), and the transmittivity (T), relative to the film thickness of the transparent electrode film 11 when the laser beam LB is irradiated to the back electrode film 13 consisting of aluminum having a thickness of 5000 Å, from the other main surface side of the substrate 10. Since the transmittivity (T) was zero it is not shown in the graph. From the optical analysis, although the absorptivity (A) of the back electrode film 13 varies periodically due to the film thickness of the transparent electrode film 11, an increment of approximately 1.6 to 2.5 times can be seen as compared with the analyzed result of the case shown in FIG. 26 when the laser beam LB has been irradiated from the exposed side of the back electrode film 13. Such increment of the absorptivity means that, the processing can be made by a laser beam having a low output power by irradiating the laser beam from the other main surface side of the substrate. In this manner, more effective use of the laser beam is obtained.

Figure 3:
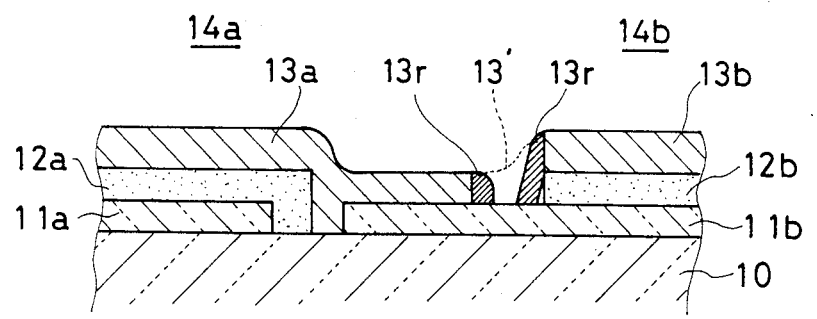
Figure 4:
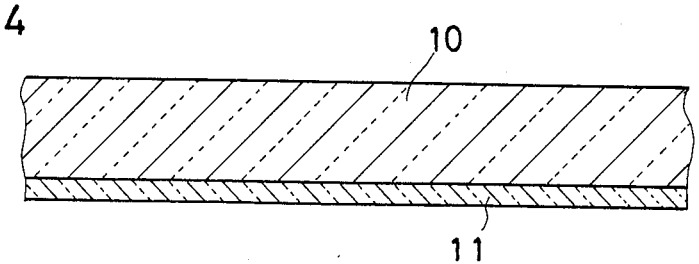
FIG. 4 through FIG. 9 are cross sectional views showing an embodiment of the present invention in sequence of process.

In the process shown in FIG. 9, since the fusion of the back electrode film 13 positioned in the adjacent spacing portion 13' to be removed, is the same as in the removing process for the amorphous semiconductor film 12, it proceeds from the interface with the transparent electrode film 11 on the incident side of the laser beam toward the exposed surface (external surface) being expanded, and breaks through the back electrode film 13 at the point where the film thickness thereof becomes thinner and disperses into the air. As a result, a clean and residue-free processing interface is obtained. Accordingly, a short-circuit inside the photoelectric converting region caused by the residue 13$r$ of the back electrode film 13, as in FIG. 3, will never occur.

FIG. 27 through FIG. 31 are cross sectional views showing another embodiment of the present invention in sequence of process. These drawings substantially correspond to FIG. 5 through FIG. 9.

Figure 27:
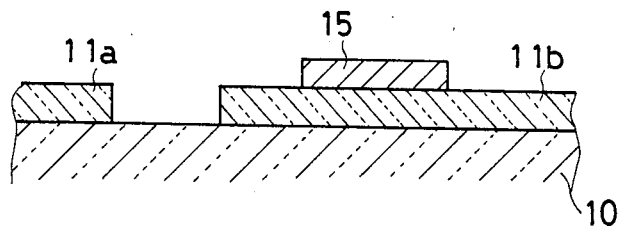
FIG. 27 through FIG. 31 are cross sectional views showing another embodiment of the present invention in sequence of process.

In the process of FIG. 27, a light transmissive insulation adiabatic layer 15 such as SiO$_2$, Si$_3$N$_4$ or the like is formed selectively on the place to be exposed of the transparent film electrode 11$a$, 11$b$, - - - already divided into each photoelectric converting region 14a, 14b, - - - by the irradiation of the laser beam LB. Such light transmissive insulation adiabatic layer 15 can be formed by the method disclosed, for example, in "Laser-induced chemical vapor deposition of SiO₂" on page 716 in the Appl. Phys. Lett. 40 issued on Apr. 15, 1982. More specifically, the light transmissive insulation adiabatic layer 15 may be formed selectively only at the place where the laser beam is irradiated by introducing silane (SiH₄) and nitrous oxide (N₂O) into the reaction chamber, and decomposing the reactant vapor with the plasma photoexcited by the ArF laser having a wave length of 193 nm.

Figure 28:
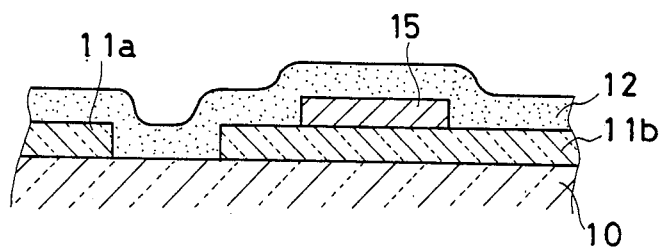
Figure 29:
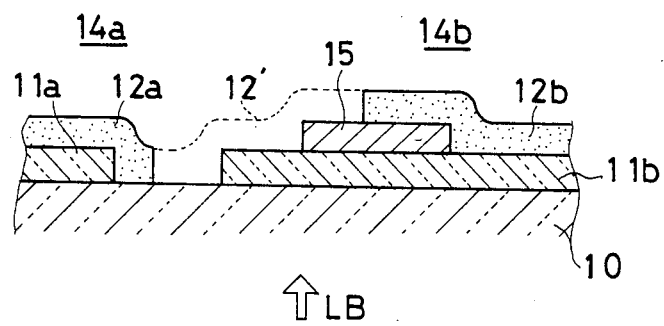

In the process in FIG. 28, similar to the process in FIG. 6, the amorphous semiconductor film 12 is formed entirely on one mainsurface of the substrate 10 covering the transparent film electrodes 11a, 11b, - - - and the translucent insulation adiabatic layer 15. Also, in the succeeding process in FIG. 29, the laser beam LB is irradiated from the other main surface side of the substrate 10, and the amorphous semiconductor film 12 is divided into each photoelectric converting region 14a, 14b, - - - .

In such process, since the adjacent spacing portion 12' is electrically bonded with the portion of the back film electrode 13a extending from the photoelectric converting region 14a on the left side, the left end of the transparent film electrode 11b in the lower layer is exposed from the amorphous semiconductor film portion 12b, and covered by the translucent insulation adiabatic layer 15 mentioned above.

Figure 30:
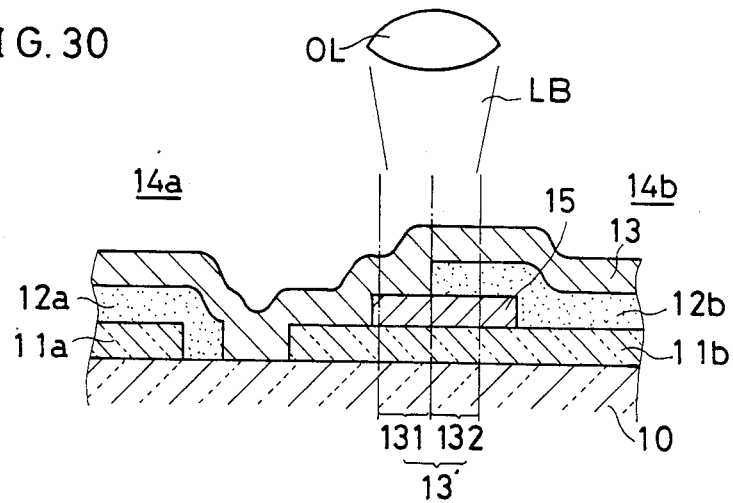

In the process in FIG. 30, a back electrode film 13 constituted by aluminum and the like is formed entirely on one main surface side of the substrate 10 covering the divided amorphous semiconductor film portions 12a, 12b, - - - , the exposed portion of the transparent film electrode 11b, and further the translucent insulation adiabatic layer 15. Thereafter, the laser beam LB is irradiated to the adjacent spacing portion 13' defined by the single chain line in FIG. 30 from the exposed surface side of the back electrode film 13, that is, from one main surface side of the substrate 10.

Figure 32:
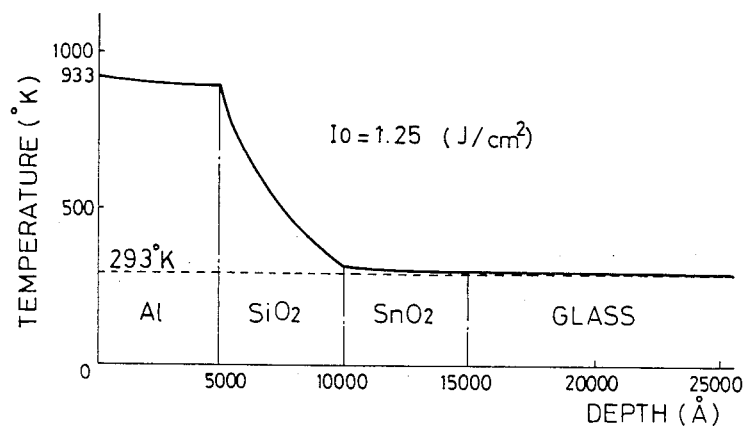
FIGS. 32 and 33 are graphs showing a temperature distribution in a depth or a thickness direction of a laminate of a light transmissive substrate, a transparent electrode film and an amorphous silicon derivative semiconductor film in the embodiment.
Figure 33:
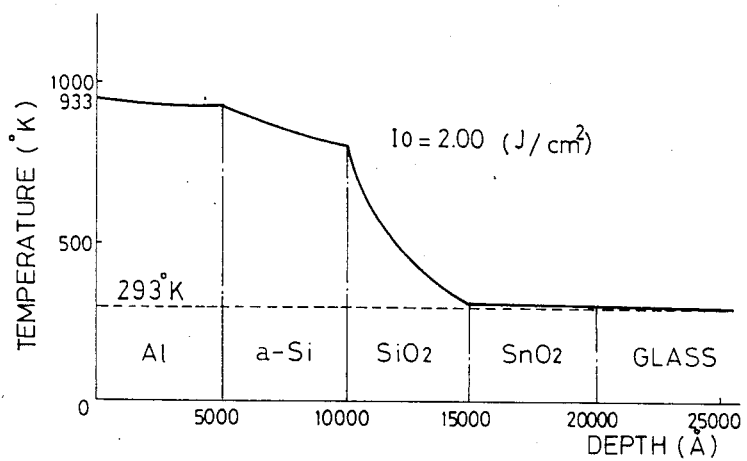

FIG. 32 shows a temperature distribution in a direction of the thickness in a region 131 of the adjacent spacing portion 13' not including the semiconductor film portion 12b amorphous silicon derivative, in a construction where the insulating adiabatic layer 15 of SiO₂ having a film thickness of 5000 Å is arranged on SnO₂ having a film thickness of 5000 Å, as mentioned above. Further, FIG. 33 shows a temperature distribution in a region 132 including the amorphous semiconductor film portion 12b.

Figure 34:
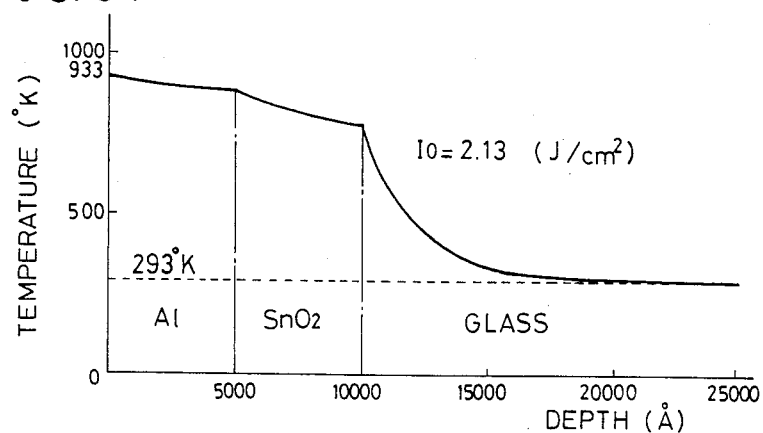
FIGS. 34 and 35 are graphs showing a temperature distribution in a depth or a thickness direction of a laminate mentioned above in a method of a comparative example.
Figure 35:
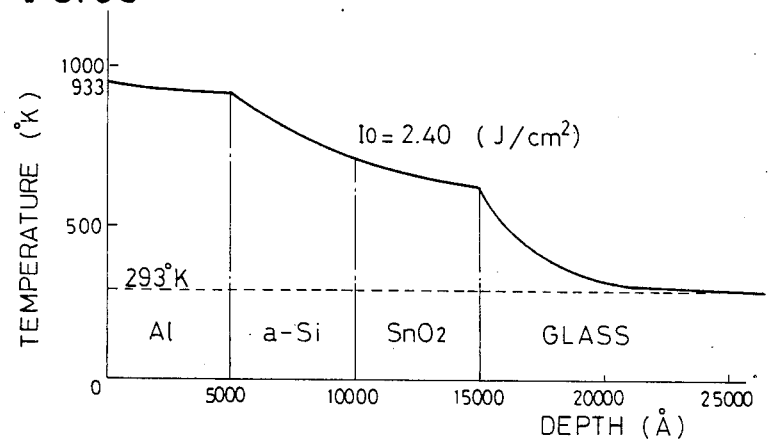

FIG. 34 shows a temperature distribution when the insulation adiabatic layer 15 is not present in the region 131, and FIG. 35 shows that when the adiabatic layer 15 is not present in the region 132 mentioned above.

The laser apparatus used are all of the pulse irradiation type having a wave length of 1.06 μm. As shown in FIG. 32 through FIG. 35, the energy density of such laser beam was set at the point required for the surface temperature of the back electrode film 13 of aluminum to be removed to reach the fusing point.

As shown in FIG. 32 through FIG. 35, by arranging the insulation adiabatic layer 15 on the transparent electrode film of the adjacent spacing portion 13' to be removed, the former serves as an adiabatic body and the transparent electrode film will not be damaged thermally. Furthermore, since the heat conduction to the transparent electrode film is interrupted, the heat dissipation is restrained, thus enabling processing by the low output power laser beam.

Figure 31:
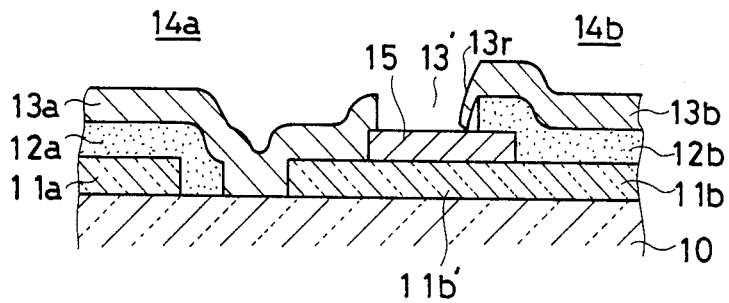

FIG. 31 shows the state wherein the adjacent spacing portion 13' of the back film electrodes 13a, 13b, - - - have been removed, and the adjacent photoelectric converting regions 14a, 14b, - - - are connected electrically in series. In photoelectric converting region, for example, in 14b, since the laser beam LB has been irradiated not from the other main surface side of the substrate 10, as shown in FIG. 30, but from the exposed surface (external surface) of the back electrode film 13, the residue 13r of the back electrode film 13 occurs on the processing interface. Although the residue 13r was causing the short circuit in the corresponding photoelectric converting region 14b in the conventional example shown in FIG. 3, as it will be understood from FIG. 31, since the exposed portion 11b' of the transparent electrode film 11b is covered by the insulation adiabatic layer 15, the photoelectric converting region 14b will not be subject to a short-circuit even in the presence of the residue 13r. The insulation adiabatic layer 15 mentioned above serves as an adiabatic body during the irradiation of the laser beam and shuts off the heat conductance to the lower layer, thereby avoiding the thermal damage and reducing the processing output power. After the irradiation, layer 15 serves as an insulator for preventing a short-circuit via the residue of the back film electrode.

With respect to the irradiating direction of the laser beam LB, although it is, difficult to determine which is better, from the point that the objective lends OL on the side of the laser apparatus PL will not be damaged by the dispersed material dissipated by such irradiation of the laser beam LB, it is better to irradiate from the other mainsurface side of the substrate 10.

FIG. 36 through FIG. 39 are cross-sectional views showing another embodiment of the present invention in sequence of process.

In the embodiment, the amorphous semiconductor film 12 and the back electrode film 13 are processed in the same process contrary to the previous embodiment, wherein the processing is carried out in separate processes.

Figure 36:
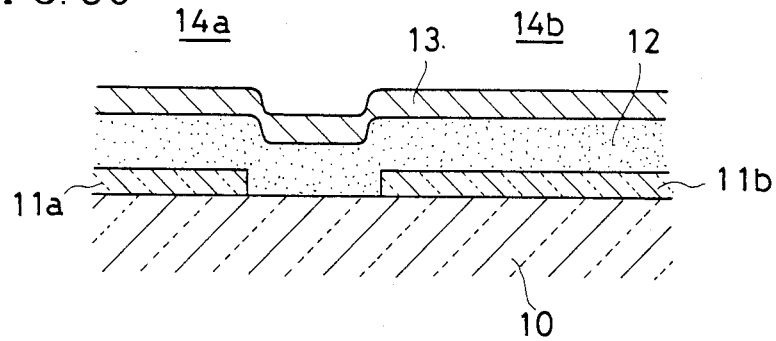
FIG. 36 through FIG. 39 are cross sectional views showing a further another embodiment of the present invention in sequence of process.

Now, in the process in FIG. 36, the amorphous silicon derivative semiconductor film 12 is formed continuously on one surface of the substrate 10 having insulation and light transmissive properties such as, for example, glass, extending over the transparent film electrodes 11a, 11b, - - - divided into each photoelectric converting region 14a, 14b, - - - . The semiconductor film 12 is formed in sequence, for example, by a P-type layer having a film thickness of about 50 Å to 200 Å formed by the glow discharge in the silicon compound atmosphere, for example, of the silane (SiH₄) vapor atmosphere adding diboron (B₂H₆) including P-type dopant, followed (1) by a I layer formed by silane vapor only, and having a film thickness of about 4000 Å to 6000 Å, and (2) by an N-type layer formed by adding phosphine (PH₃), including N type dopant to silane vapor having a film thickness of about 100 Å to 500 Å. The back electrode film 13 is constituted, for example, by aluminum having a film thickness of about 2000 Å to 1 μm is formed immediately on the amorphous semiconductor film 12 formed in such a manner. Thus, by forming the back electrode film 13 immediately after the forming of the amorphous semiconductor film 12, the attachment of dusts, moisture, other contaminants on the semiconductor film is avoided.

Figure 37:
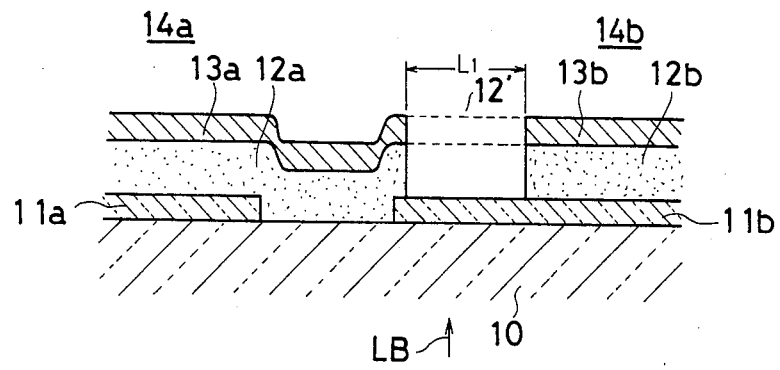

In the process in FIG. 37, the amorphous semiconductor film and the back electrode film in the adjacent spacing portion 12' are removed by irradiating the laser beam from the other main surface side of the substrate 10. Accordingly, in the process, the amorphous semiconductor film 12 and the back electrode film 13 are divided into each respective photoelectric converting region 14a, 14b, - - - . The laser apparatus used in the process in FIG. 37 is, for example, the Nd:YAG laser having a wavelength of 1.06 μm and a pulse frequency of 3 kHz. The diameter of the laser beam is adjusted so as to keep the energy density of $2 \times 10^7$ W/cm$^2$. By such irradiation of the laser beam from the other surface side of the substrate 10, the adjacent spacing portion 12' is divided by the width, for example, of about 300 μm to 500 μm.

As described above, the laser beam in the process in FIG. 37 is also irradiated from the other mainsurface side of the substrate 10 as same as the previous embodiment. Accordingly, the laser beam passes through the substrate 10 and the transparent film electrodes 11a, 11b, - - - and first reaches the amorphous semiconductor film 12 in the interface with the transparent film electrodes 11a, 11b, - - - then the semiconductor film in the adjacent spacing portion 12' to be removed is removed from the interface thereof. At this time, the amorphous semiconductor film 12 being fused by the irradiation of the laser beam is, positioned in the adjacent spacing portion 12' surrounded by the substrate 10, the transparent film electrodes 11a, 11b, - - - and the back electrode film 13. Accordingly, the fusion of the amorphous semiconductor film which has started from the interface, will proceed toward the back electrode film 13, therefrom while being expanded, and at the point where the total film thickness including the thickness of the back electrode film 13 becomes thinner, the fused material thereof will breakthrough the thinned portion. The breakthrough causes most of the fused amorphous semiconductor film to be dispersed into the air therefrom.

Figure 40:
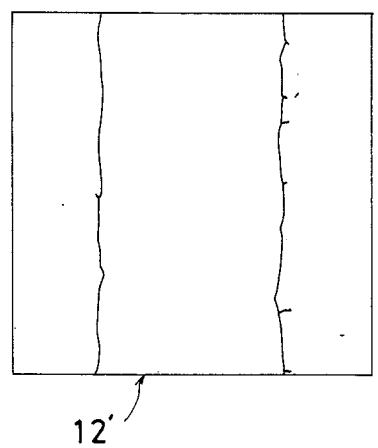
Figure 41:
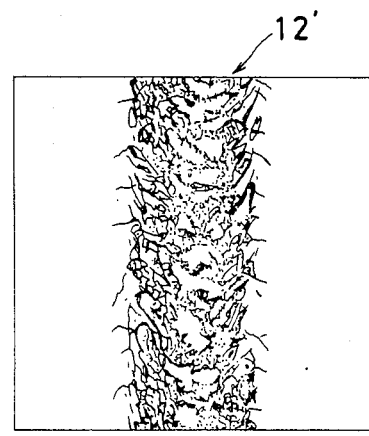

Thus, when the laser beam is irradiated from the other main surface side of the substrate 10, as shown in FIG. 40, an extremely clear processing interface may be obtained in the adjacent spacing portion 12' therof. On the contrary, when the laser beam is irradiated from one main surface side of the substrate according to the method of the comparative example, as shown in FIG. 41, the processing interface in the adjacent spacing portion thereof will become zigzag. In FIGS. 40 and 41, only the irradiating directions of the laser beam are different, with other conditions to being set identically.

Figure 38:
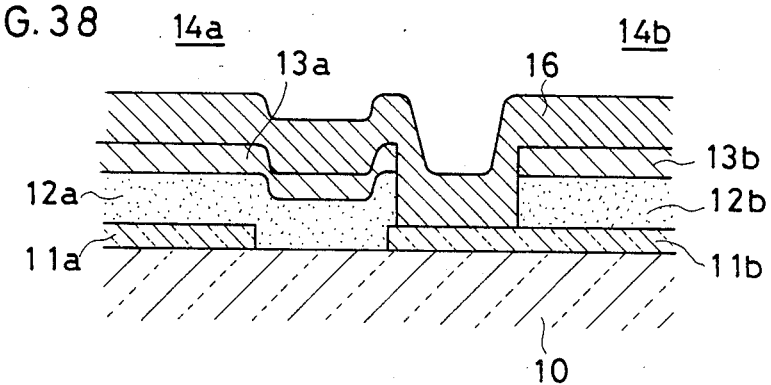

In the succeeding process in FIG. 38, a second back electrode film 16 constituted by a triple layer construction consisting, for example, of titanium or titanium silver (TiAg) of about several thousand Å, aluminum of about several thousand Å, and titanium or titanium silver of about several thousand Å to 5000 Å, formed on the amorphous semiconductor portions 12a, 12b, - - - and the back film electrodes 13a, 13b, - - - divided into each photoelectric converting region 14a, 14b, - - - by the process in FIG. 7, covering the transparent film electrodes 11a, 11b, - - - in the exposed state in the adjacent spacing portion 12'. Titanium or titanium silver used in the second back electrode film 16 is for preventing the corrosion and oxidation of the aluminum of the intermediate layer caused by moisture, and for facilitating the laser processing in the succeeding process. The aluminum layer is useful for reducing the equivalent series resistance.

Figure 39:
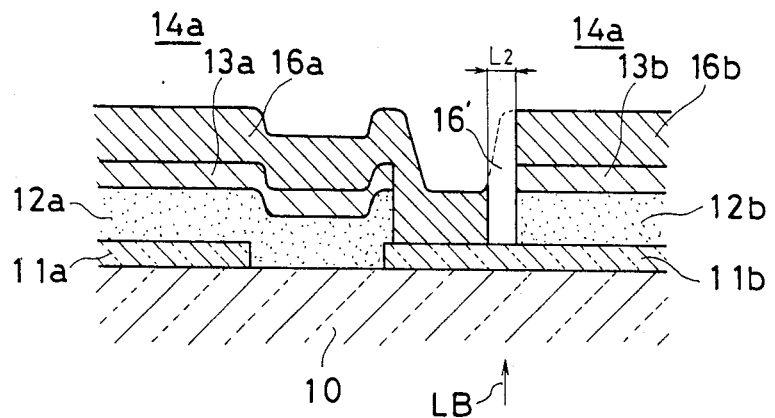

In the final process in FIG. 39, the laser beam is irradiated to the adjacent spacing portion 16' from the other main surface side of the substrate 10, and the second back film electrodes 16a, 16b, - - - in each photoelectric converting region 14a, 14b, - - - are formed. The second back film electrodes are connected to the transparent electrode film of the adjacent photoelectric converting region, accordingly respective photoelectric converting regions 14a, 14b, - - - are connected electrically in series.

Figure 42:
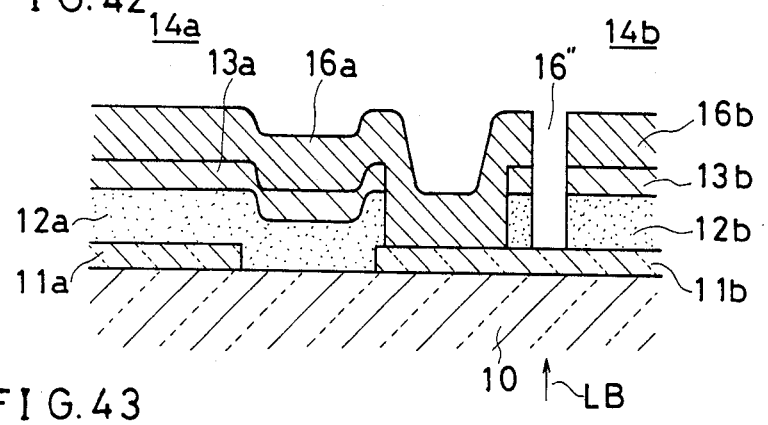
FIGS. 42 and 43 are cross sectional views for explaining, respectively, a major portion of a modified example of a different process of FIG. 39.
Figure 43:
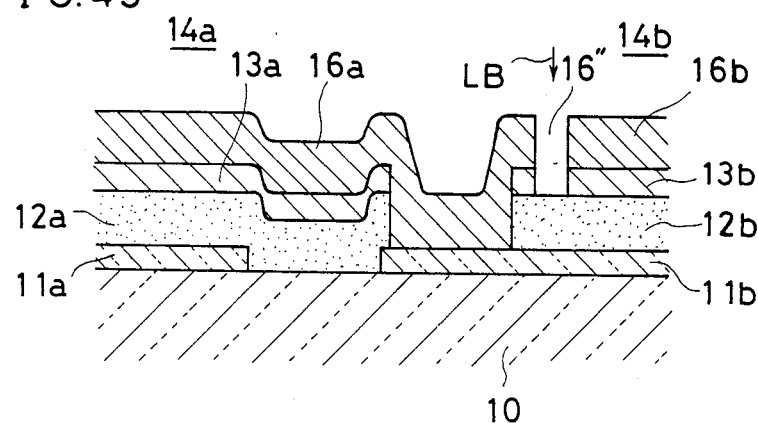

FIGS. 42 and 43 are cross sectional views respectively showing the modified example of the process in FIG. 39.

In the process in FIG. 42, the second back electrode film 16, continuously formed as in FIG. 38, is removed in the adjacent spacing portion 16'' different from the position of FIG. 39. In this case, the laser beam may be irradiated from the other main surface side of the substrate 10 as in the process in FIG. 39. Although the irradiation conditions of the laser beam are the same that in the process in FIG. 39, this process differs from the process in FIG. 39 in that not only the second back electrode film 16 but also the amorphous semiconductor film 12 and the first back electrode film 13 are removed.

Alternatively, in the process in FIG. 43, the laser beam is irradiated from the one mainsurface side of the substrate 10 in the adjacent spacing portion 16''. In this case, the back electrode film 13 and the amorphous semiconductor film 12 are lying underneath the second back electrode film 16. Accordingly, if they are removed simultaneously by the laser beam having a high energy density, the amorphous semiconductor film in the lower layer will be damaged, or since the laser beam is irradiated from the exposed surface side mentioned above, residue may remain in the processing interface.

In the embodiment of FIG. 43, the aluminum layer in the second layer is exposed by removing the top titanium layer or the titanium silver layer of the second back electrode film 16 lying on the exposed surface side; that is, removing one main surface side of the substrate 10, by irradiating the laser beam, and then removing the exposed aluminum layer by plasma etching utilizing the top titanium or titanium silver layer as the mask. Such plasma etching may be performed in a chlorinated vapor atmosphere, for example, such as CCl$_4$, BCl$_3$, for example. Next the irradiation of the laser beam and the plasma etching are repeated for the bottom titanium or titanium silver layer of the second back electrode film 16 and the first back electrode film 13 constituted by aluminum. In such a manner, in FIG. 43, the laser beam and the plasma etching are used together, and two back electrode films 16 and 13 are divided into each photoelectric converting region 14a, 14b, - - - .

Figure 45:
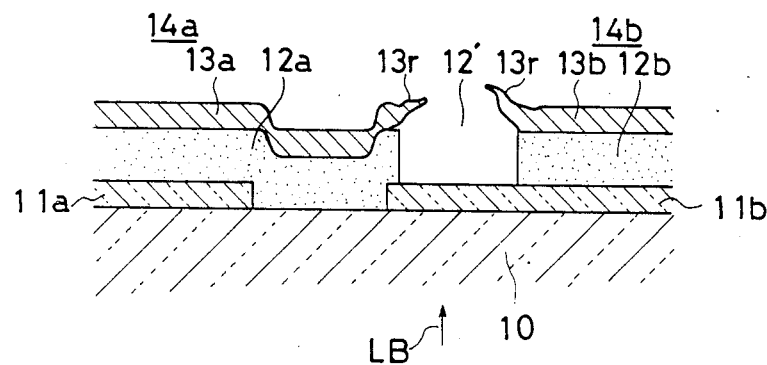
FIG. 45 is a cross sectional view showing an adjacent spacing portion in a state of FIG. 44.
Figure 44:
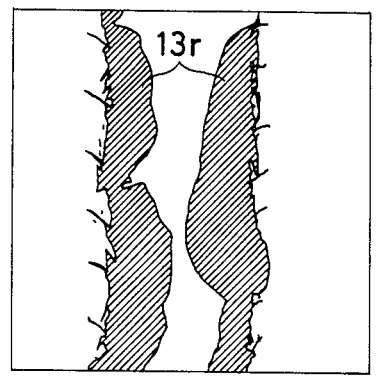
FIG. 44 is a plan view showing a certain state after a process of FIG. 39.

In the previous process in FIG. 37, when the energy density, the pulse frequency or the scanning speed of the laser beam depart from the optimum range, some residue may occur in the adjacent spacing portion 12' as shown in FIGS. 44 and 45. A main constituent of the residue is the material of the first back electrode film 13, for example, aluminum, which is in a suspending state as shown in FIG. 44, since the amorphous semiconductor layer 12 thereunder has been removed. Such residues may be suitable removed respectively by dispersing with the pressurized air from the nozzle or by sucking with the suction nozzle. After the residue has been removed, the process is brought to previous FIG. 38.

In the present embodiment, the amorphous semiconductor film and the back electrode film are divided simultaneously by the irradiation of the energy beam from the other surface side of the substrate. Accordingly, contrary to the prior art method in which residues remained after removing the adjacent spacing portion by irradiating the energy beam, such residues are almost eliminated by this method. Therefore, the peeling defect of the back electrode film may be prevented in the solar cell and the patterning precision may be improved in the linear optical sensor array.

FIG. 46 through FIG. 51 are cross sectional views showing another embodiment of the present invention.

Figure 46:
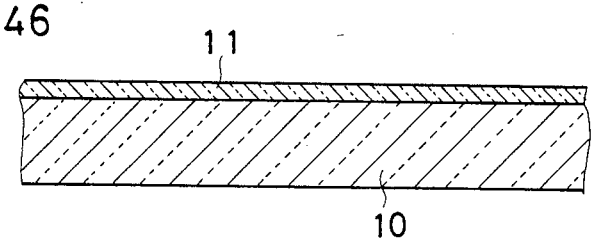
FIG. 46 through FIG. 51 are cross sectional views showing another embodiment of the present invention in sequence of process.

In the process in FIG. 46, a transparent electrode film 11 consisting of $SnO_2$, for example, is formed entirely on one main surface of the substrate 10 constituted by the transparent glass having a thickness of about 1 mm to 3 mm and an area of about 10 cm×10 cm to 40 cm×40 cm.

Figure 47:
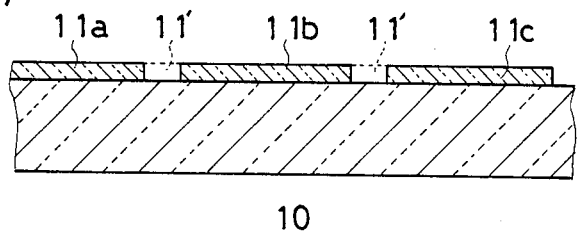

In the process in FIG. 47, the transparent electrode film lying in the adjacent spacing portion 11' is removed by the irradiation of the laser beam, and the transparent film electrode 11a, 11b, - - - is formed in each photoelectric converting region. A wavelength which is hardly absorbed by the substrate 10 is suitable for the laser apparatus used in this case and the pulse irradiation type laser apparatus having a wavelength of 0.35 μm to 2.5 μm is preferred with respect to the substrate 10 of the embodiment. In the embodiment, the Nd:YAG laser with a Q switch having the wavelength of about 1.06 μm, the energy density of 13 $J/cm^2$ and the pulse frequency of 3 kHz was used.

Figure 48:
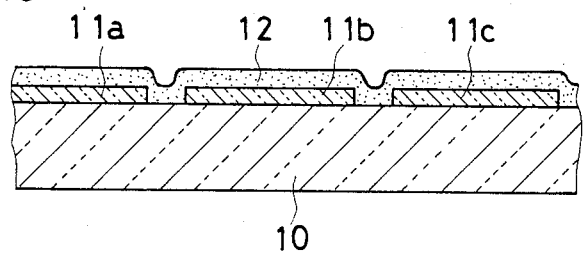

In the process in FIG. 48, the amorphous semiconductor film 12, having a film thickness of 5000 Å to 7000 Å, for example, is formed entirely on one main surface side of the substrate 10 covering the surfaces of the respective transparent film electrodes 11a, 11b, - - - . The semiconductor film 12 includes a PIN junction parallel to the film surface as in the previous embodiment.

Figure 49:
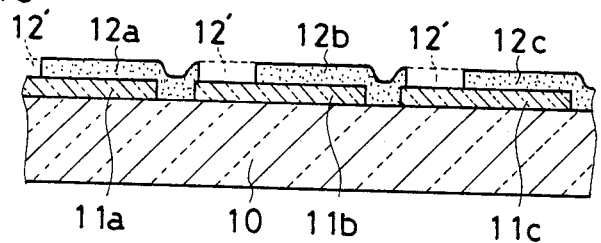

In the process in FIG. 49, the semiconductor film lying in the adjacent spacing portion 12' is removed by the irradiation of the laser beam produced in pulsation, and the amorphous semiconductor portions 12a, 12b, - - - in the respective photoelectric converting region are formed. It must be kept in mind when irradiating the laser beam in this case, that the optical characteristics of the absorptivity (A), the reflection factor (R), and the transmittivity (T), of the amorphous silicon derivative semiconductor film 12 relative to the Nd:YAG laser having a wave length of 1.06 μm are not optimal.

Figure 55:
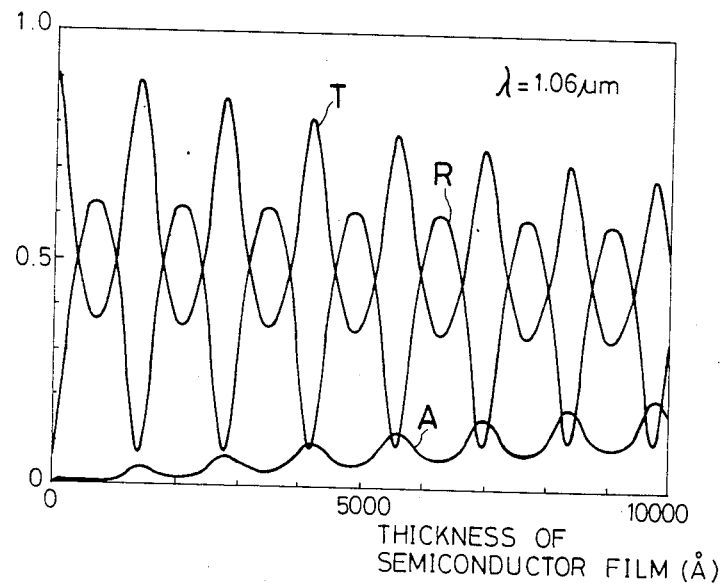
FIG. 55 is a graph showing a film thickness dependency of an optical characteristic in amorphous silicon derivative semiconductor film in a comparative example.

The amorphous semiconductor film 12 exhibits a film thickness dependency as shown in FIG. 55, relative to the Nd:YAG laser having a wavelength of 1.06 μm. Referring in greater detail, when processing the amorphous semiconductor film by the YAG laser, the film thickness thereof is equivalent to the minimum absorptivity, for example, of 5%, if the laser output power is adjusted for removing that semiconductor film portion. For example, for a semiconductor film portion having a film thickness equivalent to the absorptivity of 20%, the laser beam must have an output power of four times the removing threshold value energy density of that portion. Accordingly, in such a case, thermal damage to the transparent electrode film lying under the semiconductor film layer having a good absorptivity cannot be avoided. Similarly, if the laser beam output power is set in conformity with the semiconductor film portion having the minimum absorptivity, for example, of 20%, the semiconductor film portion having the minimum absorptivity of 5% will not be removed, thus resulting in a deterioration of the output power of the cell of the solar cell. On the contrary, in the embodiment (FIG. 49), for dividing the amorphous silicon derivative semiconductor film 12, the laser beam having the wavelength region in a substantially ultraviolet rays region and a visible rays region is used.

Figure 52:
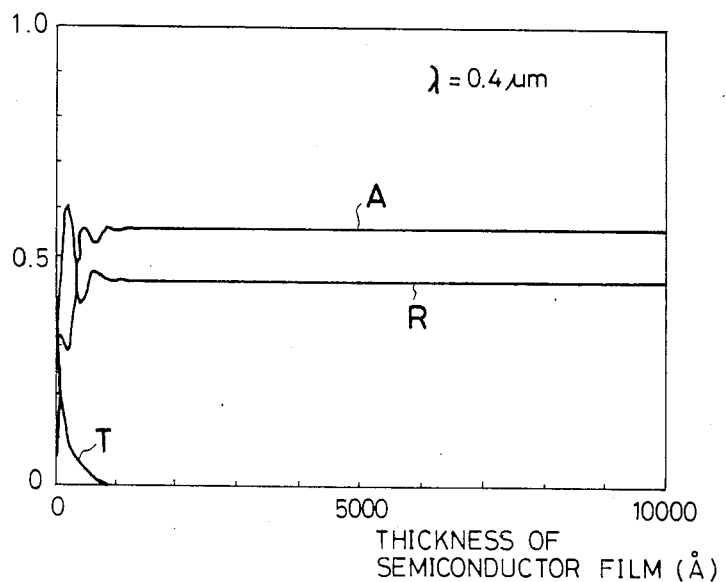
FIG. 52 through FIG. 54 are graphs respectively showing a film thickness dependency of an optical characteristic in an amorphous silicon derivative semiconductor film in each different wavelength of a laser beam.
Figure 53:
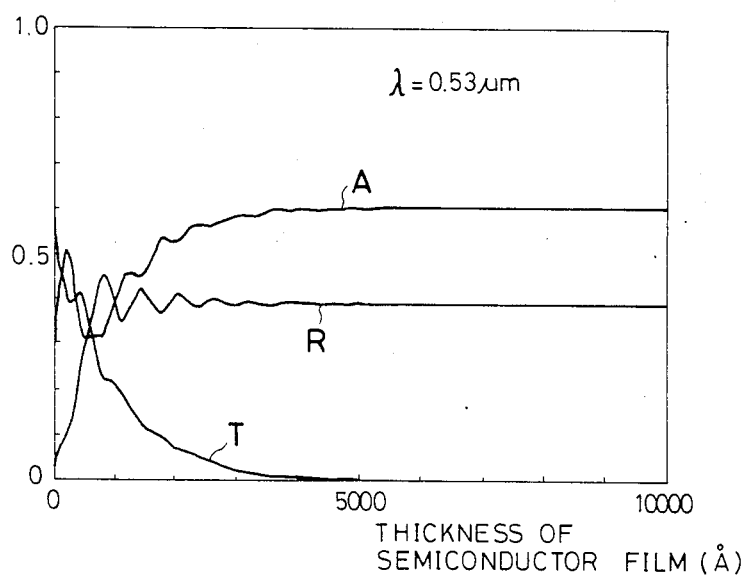
Figure 54:
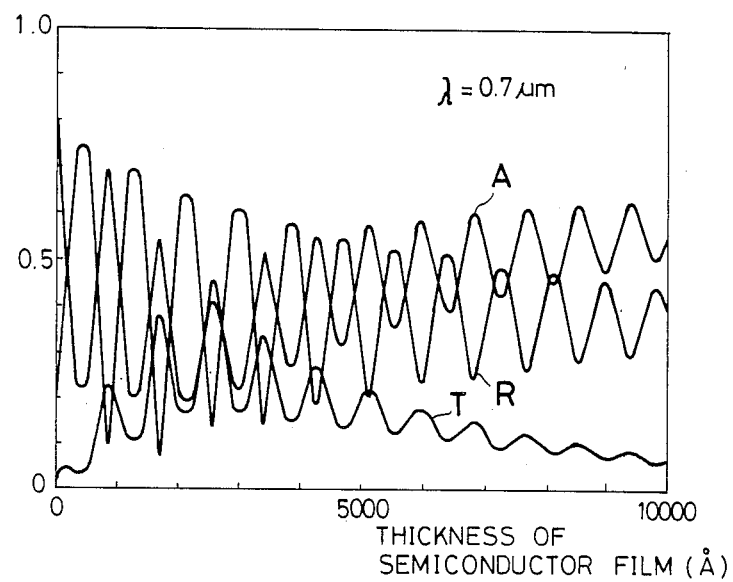

Limitation of the wavelength region will now be described. FIGS. 52, 53 and 54 are graphs showing the theoretical analysis made optically on the absorptivity (A), the reflection factor (R) and the transmittivity (T) respectively, using the wavelength (λ) of the laser beam as a parameter, on the fundamental construction constituted by the amorphous silicon derivative semiconductor film 12 formed on the transparent electrode film 11 consisting of the transparent conductive oxide (TCO), such as tin oxide having a thickness of 2000 Å arranged on the glass substrate 10 having a thickness of 2 mm for example, in the respective drawing, an abscissa denotes the film thickness of the semiconductor film 12, and an ordinate denotes respective strength. A pulse irradiation type laser was used. The wavelength of the laser beam is 0.4 μm in FIG. 52, and 0.53 μm and 0.7 μm, respectively, in FIGS. 53 and 54. These three wave lengths are within the ultraviolet rays region and the visible rays region mentioned above. As the result of such theoretical calculation, the absorptivity (A) for the pulse irradiation type laser beam in the amorphous silicon derivative semiconductor film 12 shows a generally constant value at the film thickness of about 3000 Å, which is about the film thickness practically usable as the photoactive layer of the solar cell, at the wave length (λ) of approximately 0.4 μm and 0.53 μm. Also, an intensity of the absorptivity becomes more than 0.5 which is larger than the intensity of the reflection factor and the transmittivity.

At the wavelength (λ) of around 0.7 μm, although the absorptivity (A) fluctuates within a limit of minimum 32% and maximum 64% above the practically usable film thickness of 4000 Å, the ratio between the minimum and the maximum absorptivity is about two times. This means that the laser beam output power is set to remove the semiconductor film portion having the film thickness equivalent to the minimum absorptivity, so even if such laser beam is irradiated to the semiconductor film portion having the maximum absorptivity, the thermal damage to the lower layer thereunder will be reduced as compared with the case as shown in FIG. 55. Moreover, even if the laser beam having an output power corresponding to the maximum absorptivity is irradiated to the semiconductor film portion having the minimum absorptivity, the ratio between such absorptivities is two times at the most, accordingly the unfinished portion hardly occurs.

Figure 56:
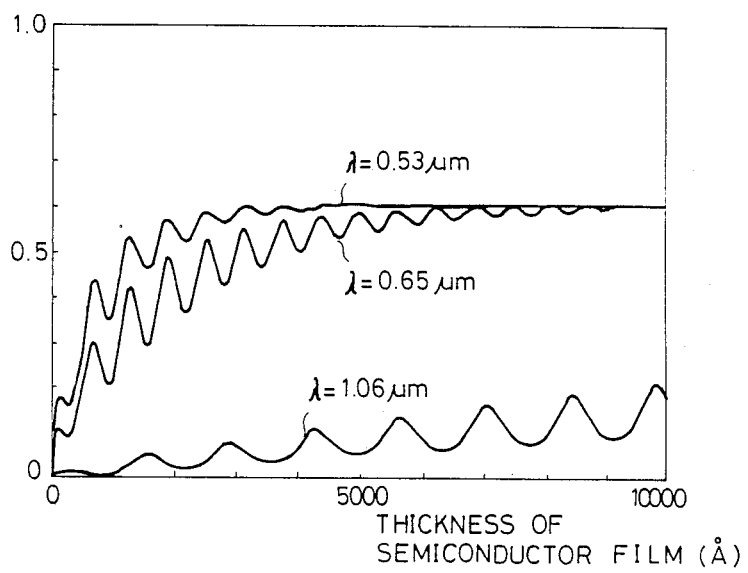
FIG. 56 is a graph showing a film thickness dependency of an absorptivity of a laser beam in an amorphous silicon derivative semiconductor film using a wavelength of a laser beam as a parameter.
Figure 57:
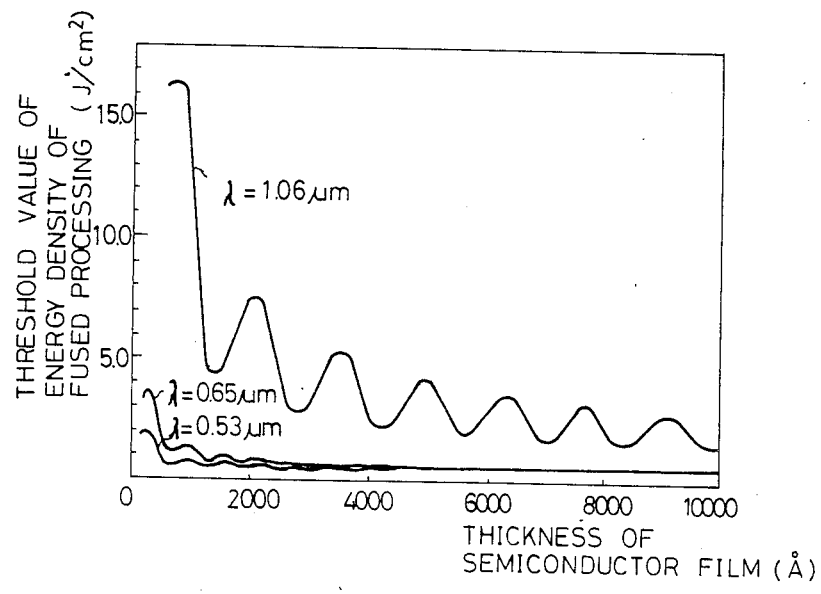
FIG. 57 is a graph showing a film thickness dependency of a threshold value of energy density of a fused processing in an amorphous silicon derivative semiconductor film using a wavelength of a laser beam as a parameter.

FIG. 56 includes graphs showing a relation between the absorptivity (A) for each laser beam having a wavelength of 0.53 μm, 0.65 μm, and 1.06 μm, with the film thickness of the amorphous silicon derivative semiconductor film 12. For the wavelengths of 0.53 μm and 1.06 μm, the graphs in FIGS. 53 and 55 have been abstracted, and for the wavelength of 0.65 μm, it has been newly added. FIG. 57 also includes graphs showing a relation between the threshold value energy density when the pulse type laser beams having the wavelength of 0.53 μm. 0.65 μm and 1.06 μm which as in FIG. 56 are irradiated to the surface of the amorphous silicon derivative semiconductor 12, and the surface thereof starts to fuse. As shown in FIGS. 56 and 57, since the absorptivity (A) in the semiconductor film portion is high even for the laser beam having the wavelength of 0.53 μm and 0.65 μm, the threshold value energy density till the fusion is small. Moreover, above the film thickness of 4000 Å which is practically usable in the solar cell, the threshold value energy density hardly fluctuates, exhibiting the constant value (about 0.5 J/cm$^2$).

Figure 58:
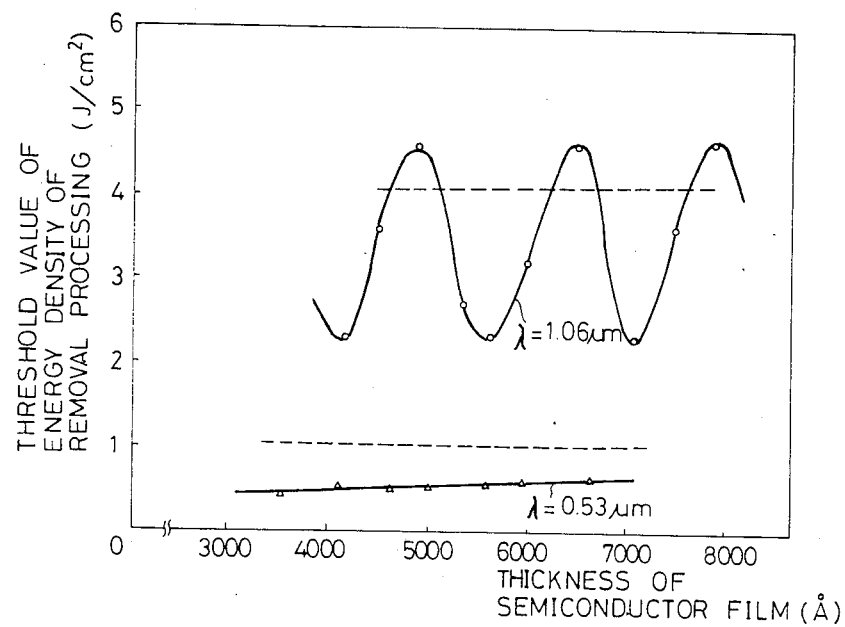
FIG. 58 is a graph showing a film thickness dependency of a threshold value energy density of a removal processing in an amorphous silicon derivative semiconductor film using a wavelength of a laser beam as a parameter.

FIG. 58 includes graphs showing a relation measured on the threshold value energy density necessary for removing the amorphous silicon derivative semiconductor film 12 and the film thickness, by using pulse irradiation type laser apparatus having the wavelengths of 1.06 μm and 0.53 μm, in practice, and based upon the optical and theoretical analysis described above. The dotted lines in FIG. 58 denote the threshold value energy density at respective wavelengths, whereby the transparent electrode film 11 under the semiconductor film 12 is exposed to thermal damage. Meanwhile, in the experiment, since it has been confirmed from the theoretical analysis in FIGS. 52 through 54, that the wavelengths of 0.65 μm and 0.4 μm show the same trend as the wavelength of 0.53 μm, the comparison was made only on the two wavelengths of 0.53 μm and 1.06 μm described above.

As shown from FIG. 58, when the amorphous silicon derivative semiconductor film 12 is processed, there is a place where the threshold value energy density of the removal processing exceeds the threshold value energy density, whereby the transparent electrode film 11 lying thereunder is exposed to thermal damage. Accordingly in order to avoid such thermal damage, the energy density of the laser beam must be reduced. However, if the energy density is reduced, although the thermal damage can be avoided, the semiconductor film 12 may not be processed sufficiently. However, when the pulse irradiation type laser apparatus having a wavelength of 0.53 μm is used, good processing can be performed even at the fluctuation of the film thickness to some extent, since the threshold value energy density of the removal processing is almost independent of the thickness of the amorphous silicon derivative semiconductor film 12. Also the value thereof is smaller than the threshold value energy density responsible for the thermal damage to the transparent electrode film 11.

Figure 59:
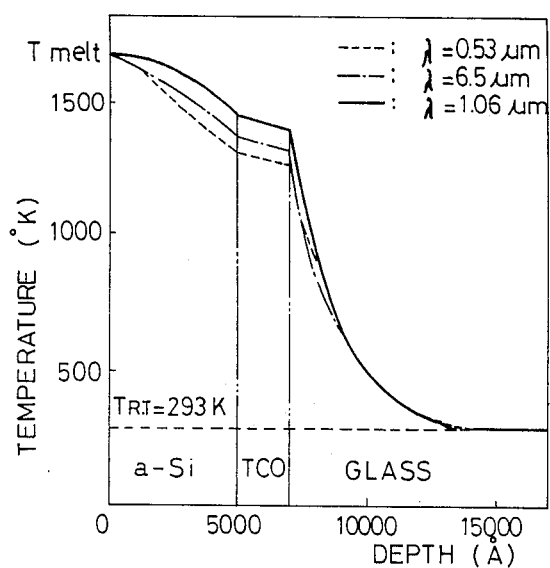
FIG. 59 is a graph showing a temperature distribution in a depth or a thickness direction when a semiconductor film surface of the present embodiment, and a comparative example have reached a fusing point (Tmelt).

Furthermore, FIG. 59 shows the analysis of the temperature distribution in a direction of a depth or a thickness using a wavelength of the laser beam as a parameter, when the surface of the amorphous silicon derivative semiconductor film 12 having the film thickness of 5000 Å has reached the fusing point. FIG. 59 shows that the shorter the wavelength of the laser beam, the lower the interface temperature between the semiconductor film and the transparent electrode film, accordingly the reduction of the thermal damage to the transparent electrode film 11 may be schemed.

Figure 60:
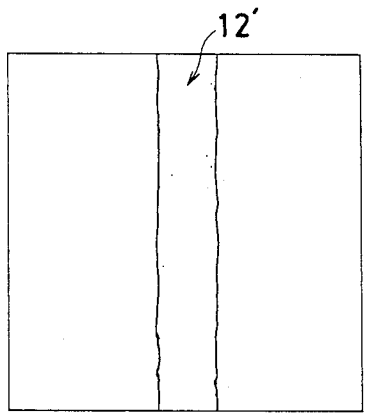
FIG. 60 is an illustrated view showing an adjacent spacing portion of an amorphous silicon derivative semiconductor film according to the embodiment.
Figure 61:
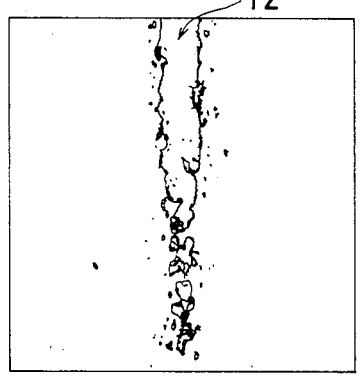
FIG. 61 is an illustrated view showing a same portion by a method of a comparative example.

FIGS. 60 and 61 are enlarged plan views of the adjacent spacing portion when the semiconductor film 12 formed by the glow discharge, so as to obtain the amorphous silicon derivative semiconductor film having the designed film thickness of 5500 Å, is processed by the laser beam having the energy density sufficient for processing the designed film thickness of 5500 Å. FIG. 60 shows the case when the laser beam having the wavelength of approximately 0.53 μm and an energy density of 0.6 J/cm$^2$ is used, while FIG. 61 shows the case when that of the laser beam being used are 1.06 μm and 3 J/cm$^2$ respectively. In both cases, the pulse irradiation type laser apparatus was used and the laser beam was scanned at such a scanning speed that the pulse laser beam will overlap.

When the process in FIG. 49 has been performed, as shown in FIG. 60, the semiconductor film in the portion where the laser beam is irradiated is removed lineally to the scanning direction and the processing interface is very clear. On the contrary, in the case shown in FIG. 61, it is apparent that the semiconductor film in the portion where the film thickness is outside the designed value, is not completely removed.

Thus, by irradiating the laser beam having the wavelength region of a substantially ultraviolet rays region and a visible rays region in pulsation, the semiconductor film in the adjacent spacing portion 12' is removed and the semiconductor film portions 12a, 12b, 12c, - - - in each respective photoelectric converting region are formed.

Figure 50:
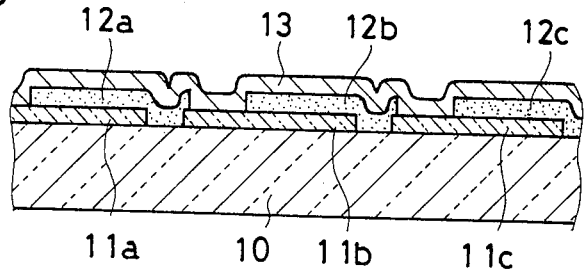

Thereafter, the process in FIG. 50 will follow. In the process in FIG. 50, the back electrode film 13 having a thickness of about 4000 Å to 2 μm is formed on one main surface of the substrate 10 covering the respective exposed portions of the semiconductor film portions 12a, 12b, 12c, - - - and the transparent film electrodes 11a, 11b, 11c, - - - . The back electrode film 13 can be provided by a single layer construction of aluminum laminated by titanium or titanium silver, or a construction constituted by such double layer stacked in duplicate may be considered.

Figure 51:
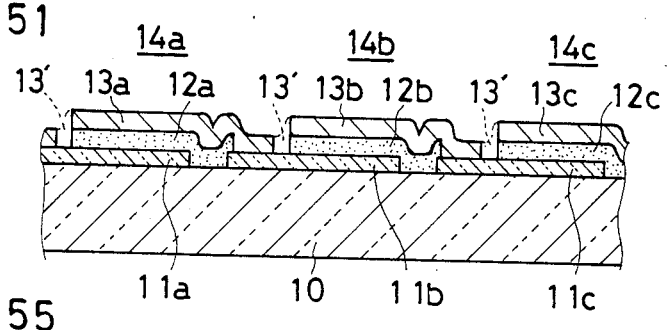

In the final process in FIG. 51, the back electrode film in the adjacent spacing portion 13' is removed by the irradiation of the laser beam and the back film electrodes 13a, 13b, 13c, - - - in each respective photoelectric converting region are formed.

Figure 62:
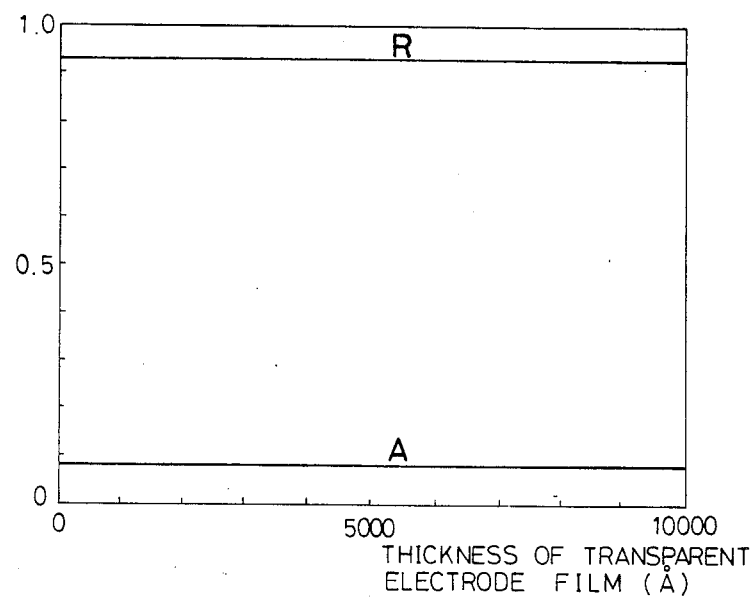
FIG. 62 is a graph showing a dependency of an optical characteristic of a back electrode film relative to a film thickness of a transparent electrode film.
Figure 63:
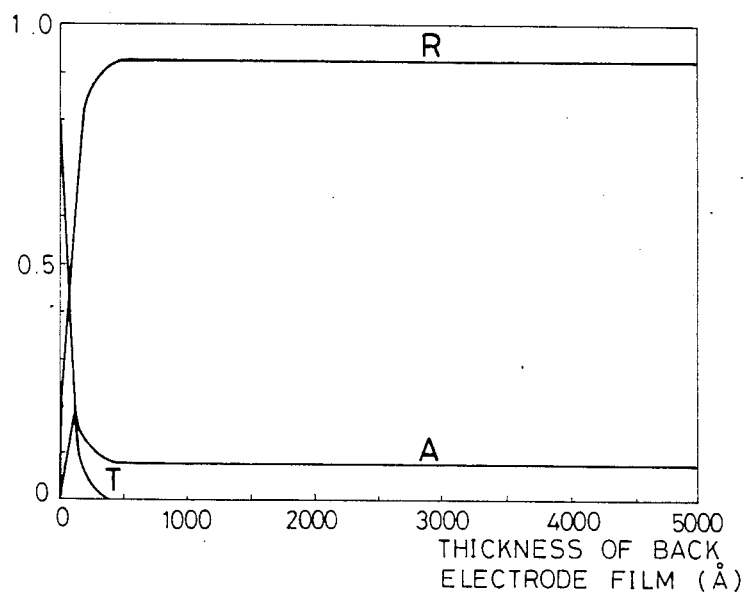
FIG. 63 is a graph showing a dependency of an optical characteristic of a back electrode film relative to a film thickness of the back electrode film.

FIGS. 62 and 63 are graphs showing the optical analysis of the dependency of the transparent electrode film 11 relative to the film thickness, and the dependency of the back electrode film 13 at 2000 Å of the thickness of the tranparent electrode film, when the laser beam is irradiated to the back electrode film 13 constituted by a single layer of aluminum of 5000 Å, thickness, with respect to the absorptivity (A) and the reflection factor (R). FIGS. 62 and 63 show the case when the wavelength of the laser beam is 1.06 μm. As the result of analysis of FIGS. 62 and 63, it will be understood that although the absorptivity of the back electrode film 13 is less than 10% for the wavelength, the removal processing of the back electrode film 13 constituted by the single layer aluminum having a thickness practically usable is not under the influence of the film thickness of the transparent electrode film 11 and the back electrode film 13.

Thus, when the amorphous silicon derivative semiconductor film is processed by the laser beam having the wavelength in a substantially ultraviolet rays region and a visible rays region, since the variation of processing threshold value energy density due to the film thickness of the semiconductor film is restrained as shown in FIG. 57, and the temperature difference between both surfaces of the semiconductor film is increased as shown in FIG. 59, the damage to the lower transparent electrode film or the insufficient processing will not occur.

Meanwhile, the translucent insulation adiabatic layer 15 of the embodiment shown in FIGS. 27 through 30, may be applied similarly in the embodiments in FIGS.

36 through 39, FIGS. 42 and 43, and in FIGS. 46 through 51.

In the embodiment in FIGS. 46 through 51, when the laser beam having the wavelength in a substantially ultraviolet rays region and a visible rays region will be irradiated, the irradiating direction thereof may be either from one main surface side of the substrate 10 as shown in FIG. 12 or from the other main surface side as shown in FIG. 11.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the following steps;
    a step for preparing a substrate,
    a step for forming a semiconductor film continuously on one main surface of said substrate, and
    a step for irradiating an energy beam capable of passing through said substrate from the other main surface of said substrate and removing the semiconductor film in that portion, thereby dividing said semiconductor film into a plurality of regions.

2. A manufacturing method in accordance with claim 1, wherein a step for preparing said substrate includes a step for preparing a light transmissive substrate and a step for dividing said semiconductor film includes a step for irradiating a laser beam.

3. A manufacturing method in accordance with claim 2, which further comprises before the step for forming said semiconductor film on said light transmissive substrate, a step for forming a transparent film electrode being divided into a plurality of regions and wherein a semiconductor film extending continuously over one main surface of said light transmissive substrate and covering respective said transparent electrode film is formed at the step for forming said semiconductor film.

4. A manufacturing method in accordance with claim 2, wherein a step for dividing said semiconductor film includes a step for irradiating a laser beam having a wavelength covering a substantially ultraviolet rays region and a visible rays region to adjacent spacing portions.

5. A manufacturing method in accordance with claim 3, which further comprises after a step for dividing a semiconductor film, a step for forming a back electrode film continuously covering respective divided semiconductor film portions and a step for irradiating a laser beam to said back electrode film and removing the back electrode film in that portion, thereby dividing said back electrode film into each region.

6. A manufacturing method in accordance with claim 3, which further comprises a step for forming an insulation adiabatic layer on respective said transparent film electrodes, a step for forming a back electrode film continuously covering said respective transparent electrode films and insulation adiabatic layer thereof and a step for irradiating an energy beam from one main surface side of said substrate and removing said back electrode film in that portion, thereby dividing said back electrode film into each region.

7. A manufacturing method in accordance with claim 5, wherein a step for dividing said back electrode film includes a step for irradiating a laser beam from the other main surface side of said light transmissive substrate.

8. A manufacturing method in accordance with claim 7, wherein a step for dividing said back electrode film includes a step for irradiating an energy beam from one main surface side of said substrate.

9. A manufacturing method in accordance with claim 7, wherein a step for dividing said back electrode film includes a step for irradiating a laser beam having a wavelength covering a substantially ultraviolet rays region and a visible rays region.

10. A manufacturing method in accordance with claim 4, wherein a wavelength of said laser beam is selected from 0.30 $\mu$m to 0.820 $\mu$m.

11. A manufacturing method in accordance with claim 10, wherein said wave length is selected at 0.53 $\mu$m approximately.

12. A manufacturing method in accordance with claim 9, wherein a wavelength of said laser beam is selected from 0.30 $\mu$m to 0.820 $\mu$m.

13. A method of manufacturing a semiconductor device comprising following steps;
    a step for preparing a light transmissive substrate,
    a step for forming transparent film electrodes being divided in each region on one main surface of said light transmissive substrate,
    a step for forming a semiconductor film continuously on one main surface of said light transmissive substrate covering transparent film electrodes of said respective region,
    a step for forming a back electrode film continuously immediately after said semiconductor film has been formed covering the semiconductor film, and
    a step for irradiating a laser beam from the other main surface of said light transmissive substrate and removing said semiconductor film and said back electrode film in that portion, thereby dividing said semiconductor film and said back electrode film into each region.

14. A manufacturing method in accordance with claim 13, which further comprises a step for forming connection electrodes on back film electrodes in respective region being connected to said transparent film electrodes in adjacent regions.

15. A manufacturing method in accordance with claim 13, wherein a step for dividing said semiconductor film and said back electrode film includes a step for irradiating a laser beam having a wavelength covering a substantially ultraviolet rays region and a visible rays region.

16. A manufacturing method in accordance with claim 14, wherein a step for forming said connection electrode includes a step for forming a connection electrode film entirely on one main surface side of said light transmissive substrate covering exposed transparent film electrodes and a step for irradiating an energy beam to the connection electrode film and removing the connection electrode film in that portion, thereby dividing said connection electrode film into each region.

17. A manufacturing method in accordance with claim 16, wherein a step for dividing said connection electrode film includes a step for irradiating a laser beam from the other main surface side of said light transmissive substrate.

18. A manufacturing method in accordance with claim 16, wherein a step for dividing said connection electrode film includes a step for irradiating an energy beam from one main surface side of said light transmissive substrate.

19. A manufacturing method in accordance with claim 17, wherein said a step for dividing said connection electrode film includes a step irradiating a laser beam having a wavelength covering a substantially ultraviolet rays region and a visible rays region.

20. A manufacturing method in accordance with claim 18, wherein at a step for dividing said connection electrode film, said semiconductor film portion lying thereunder is retained.

21. A manufacturing method in accordance with claim 15, wherein a wavelength of said laser beam is selected from 0.30 μm to 0.820 μm.

22. A manufacturing method in accordance with claim 21, wherein said wavelength is selected at 0.53 μm approximately.

23. A method of manufacturing a semiconductor device comprising the following step;
   a step for preparing a substrate,
   a step for forming a semiconductor film consisting mainly of amorphous silicon on one mainsurface side of said substrate, and
   a step for irradiating through said substrate form the other main surface a laser beam having a wavelength covering a substantially ultraviolet rays region and a visible rays region for removing said semiconductor film from the irradiated portion, thereby dividing said semiconductor film into a plurality of regions.

24. A manufacturing method in accordance with claim 23, wherein a wavelength of said laser beam is selected from 0.30 μm to 0.820 μm.

25. A manufacturing method in accordance with claim 23, wherein a step for preparing said substrate includes a step for preparing a light transmissive substrate and a step for dividing said semiconductor film includes a step for irradiating a laser beam having said wavelength from the other main surface side of said light transmissive substrate.

26. A manufacturing method in accordance with claim 24, wherein said wavelength is selected at 0.53 μm approximately.

27. A method of manufacturing a semiconductor device comprising the following steps;
   a step for preparing a light transmissive substrate,
   a step for forming a semiconductor film consisting mainly of amorphous silicon having a photoelectric converting function on one main surface of said light transmissive substrate,
   a step for forming a back electrode film on said semiconductor film, and
   a step for irradiating through said substrate a laser beam having a wavelength covering a substantially ultraviolet rays region and a visible rays region from the other main surface side of said light transmissive substrate and removing said semiconductor film and said back electrode film from the irradiated portion, thereby dividing said semiconductor film and said back electrode film into a plurality of regions.

28. A manufacturing method in accordance with claim 19, wherein a wavelength of said laser beam is selected from 0.30 μm to 0.820 μm.

29. A manufacturing method in accordance with claim 28, wherein said wavelength is selected at 0.53 μm approximately.

* * * * *